(12) United States Patent
Mitsuki et al.

(10) Patent No.: US 6,830,994 B2
(45) Date of Patent: Dec. 14, 2004

(54) METHOD OF MANUFACTURING A SEMICONDUCTOR DEVICE HAVING A CRYSTALLIZED SEMICONDUCTOR FILM

(75) Inventors: Toru Mitsuki, Kanagawa (JP); Takeshi Shichi, Kanagawa (JP); Shinji Maekawa, Kanagawa (JP); Hiroshi Shibata, Kanagawa (JP); Akiharu Miyanaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 156 days.

(21) Appl. No.: 10/091,338

(22) Filed: Mar. 6, 2002

(65) Prior Publication Data

US 2002/0155706 A1 Oct. 24, 2002

(30) Foreign Application Priority Data

Mar. 9, 2001 (JP) ........................................ 2001-067618

(51) Int. Cl.[7] ............................................. H01L 21/20
(52) U.S. Cl. ........................ 438/486; 438/482; 438/149; 438/151
(58) Field of Search ........................... 438/149, 151, 438/160, 482, 486, 485

(56) References Cited

U.S. PATENT DOCUMENTS

| 5,147,826 A | 9/1992 | Liu et al. |
| 5,262,350 A | 11/1993 | Yamazaki et al. |
| 5,275,851 A | 1/1994 | Fonash et al. |

(List continued on next page.)

FOREIGN PATENT DOCUMENTS

| JP | 04-035021 | 2/1992 |
| JP | 04-286336 | 10/1992 |
| JP | 07-162004 | 6/1995 |
| JP | 07-183540 | 7/1995 |
| JP | 10-270363 | 10/1998 |
| JP | 2000-058839 | 2/2000 |
| WO | WO 93-10555 | 5/1993 |

OTHER PUBLICATIONS

Official Action dated Mar. 1, 2004, from U.S. application No. 09/362,192, filed Jul. 28, 1999.
H. Tsutsu, *Recent Progress of Low Temperature Poly–Si Technology*, Electronic Display Forum, pp. 4–31 to 4–38 and English Translation, pp. 1–2, Apr. 14, 1999.
Kenji Sera et al., *Uniformity Improvement of Excimer Laser Crystallized Poly–Si Thin Film Transistors*, AM–LCD '96/IDM '96, pp. 85–88.

(List continued on next page.)

*Primary Examiner*—Richard Elms
*Assistant Examiner*—Brad Smith
(74) *Attorney, Agent, or Firm*—Eric J. Robinson; Robinson Intellectual Property Law Office, P.C.

(57) ABSTRACT

The number of grains in active regions of devices can be made uniform by making the grains of crystalline semiconductor films, obtained by thermal crystallization using a metal element, smaller. The present invention is characterized in that a semiconductor film is exposed within an atmosphere in which a gas, having as its main constituent one or a plurality of members from the group consisting of inert gas elements, nitrogen, and ammonia, is processed into a plasma, and then thermal crystallization using a metal element is performed. The concentration of crystal nuclei1 generated is thus increased, making the grain size smaller, by performing these processes. Heat treatment may also be performed, of course, after exposing the semiconductor film, to which the metal element is added, to an atmosphere in which a gas, having as its main constituent one or a plurality of members from the group consisting of inert gas elements, nitrogen, and ammonia, is processed into a plasma.

23 Claims, 19 Drawing Sheets

U.S. PATENT DOCUMENTS

| | | | |
|---|---|---|---|
| 5,278,093 A | 1/1994 | Yonehara | |
| 5,344,796 A | 9/1994 | Shin et al. | |
| 5,352,291 A | 10/1994 | Zhang et al. | |
| 5,387,542 A | 2/1995 | Yamamoto et al. | |
| 5,403,772 A | 4/1995 | Zhang et al. | |
| 5,424,230 A | 6/1995 | Wakai | |
| 5,486,237 A | 1/1996 | Sano et al. | |
| 5,488,000 A | 1/1996 | Zhang et al. | |
| 5,501,989 A | 3/1996 | Takayama et al. | |
| 5,529,937 A | 6/1996 | Zhang et al. | |
| 5,531,182 A | 7/1996 | Yonehara | |
| 5,550,070 A | 8/1996 | Funai et al. | |
| 5,578,520 A | 11/1996 | Zhang et al. | |
| 5,582,880 A | 12/1996 | Mochizuki et al. | |
| 5,605,846 A | 2/1997 | Ohtani et al. | |
| 5,612,250 A | 3/1997 | Ohtani et al. | |
| 5,621,224 A | 4/1997 | Yamazaki et al. | |
| 5,624,873 A | 4/1997 | Fonash et al. | |
| 5,637,512 A | 6/1997 | Miyasaka et al. | |
| 5,643,826 A | 7/1997 | Ohtani et al. | |
| 5,654,203 A | 8/1997 | Ohtani et al. | |
| 5,712,191 A | 1/1998 | Nakajima et al. | |
| 5,744,824 A | 4/1998 | Kousai et al. | |
| 5,756,364 A | 5/1998 | Tanaka et al. | |
| 5,766,360 A | 6/1998 | Sato et al. | |
| 5,773,327 A | 6/1998 | Yamazaki et al. | |
| 5,783,468 A | 7/1998 | Zhang et al. | |
| 5,795,795 A | 8/1998 | Kousai et al. | |
| 5,811,323 A | 9/1998 | Miyasaka et al. | |
| 5,811,327 A | 9/1998 | Funai et al. | |
| 5,821,138 A | 10/1998 | Yamazaki et al. | |
| 5,824,573 A | 10/1998 | Zhang et al. | |
| 5,824,574 A | 10/1998 | Yamazaki et al. | |
| 5,830,784 A | 11/1998 | Zhang et al. | |
| 5,840,118 A | 11/1998 | Yamazaki | |
| 5,843,225 A | 12/1998 | Takayama et al. | |
| 5,851,860 A | 12/1998 | Makita et al. | |
| 5,851,862 A | 12/1998 | Ohtani et al. | |
| 5,854,096 A | 12/1998 | Ohtani et al. | |
| 5,858,819 A | 1/1999 | Miyasaka | |
| 5,858,823 A | 1/1999 | Yamazaki et al. | |
| 5,861,337 A | 1/1999 | Zhang et al. | |
| 5,869,362 A | 2/1999 | Ohtani | |
| 5,873,942 A | 2/1999 | Park et al. | |
| 5,879,977 A | 3/1999 | Zhang et al. | |
| 5,882,165 A | 3/1999 | Maydan et al. | |
| 5,882,960 A | 3/1999 | Zhang et al. | |
| 5,897,347 A | 4/1999 | Yamazaki et al. | |
| 5,900,105 A | 5/1999 | Toshima | |
| 5,904,770 A | 5/1999 | Ohtani et al. | |
| 5,923,962 A | 7/1999 | Ohtani et al. | |
| 5,923,968 A | 7/1999 | Yamazaki et al. | |
| 5,923,997 A | 7/1999 | Mitanaga et al. | |
| 5,937,282 A | 8/1999 | Nakajima et al. | |
| 5,953,597 A | 9/1999 | Kusumoto et al. | |
| 5,956,581 A | 9/1999 | Yamazaki et al. | |
| 5,966,594 A | 10/1999 | Adachi et al. | |
| 5,976,259 A | 11/1999 | Yamazaki | |
| 5,985,704 A | 11/1999 | Adachi et al. | |
| 5,985,741 A | 11/1999 | Yamazaki et al. | |
| 5,986,286 A | 11/1999 | Yamazaki et al. | |
| 5,994,172 A | 11/1999 | Ohtani et al. | |
| 6,008,101 A | 12/1999 | Tanaka et al. | |
| 6,048,758 A | 4/2000 | Yamazaki et al. | |
| 6,066,516 A | 5/2000 | Miyasaka | |
| 6,077,759 A | 6/2000 | Yamazaki et al. | |
| 6,140,165 A | 10/2000 | Zhang et al. | |
| 6,156,627 A | 12/2000 | Zhang et al. | |
| 6,160,827 A | 12/2000 | Tanaka | |
| 6,165,876 A | 12/2000 | Yamazaki et al. | |
| 6,197,624 B1 | 3/2001 | Yamazaki | |
| 6,285,042 B1 | 9/2001 | Ohtani et al. | |
| 6,294,441 B1 | 9/2001 | Yamazaki | |
| 6,319,761 B1 | 11/2001 | Zhang et al. | |
| 6,337,229 B1 | 1/2002 | Yamazaki et al. | |
| 6,506,636 B2 * | 1/2003 | Yamazaki et al. | 438/149 |

OTHER PUBLICATIONS

M. Bonnel et al., *Polycrystalline Silicon Thin–Film Transistors with Two–Step Annealing Process*, IEEE Electron Device Letters, vol. 14, No. 12, pp. 551–553, Dec. 1993.

M. Fuse et al., *Performance of Poly–Si Thin Film Transistors Fabricated by Excimer–Laser Annealing of $SiH_4$ and $Si_2H_4$ Source Low Pressure Vapor Deposited o–Si Films With or Without Solid–Phase Crystallization*, Solid State Phenomena, vols. 37–38, pp. 565–570, 1994.

* cited by examiner

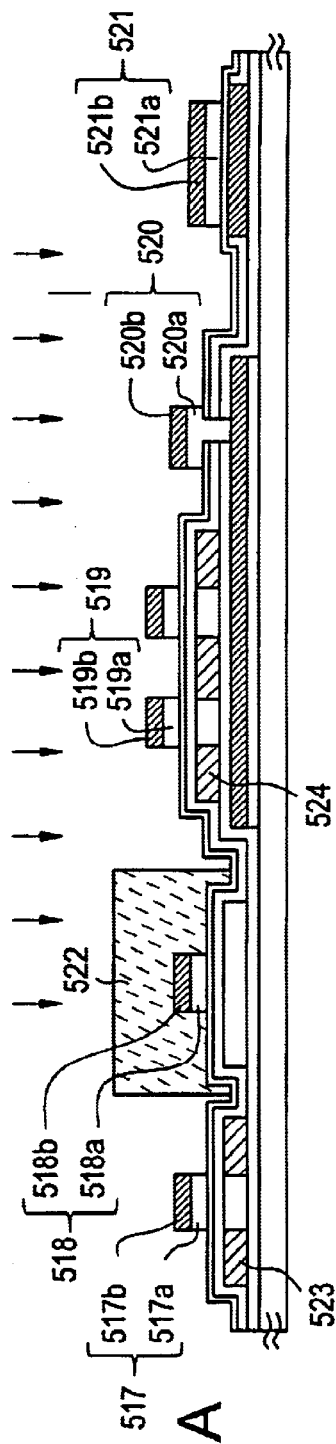
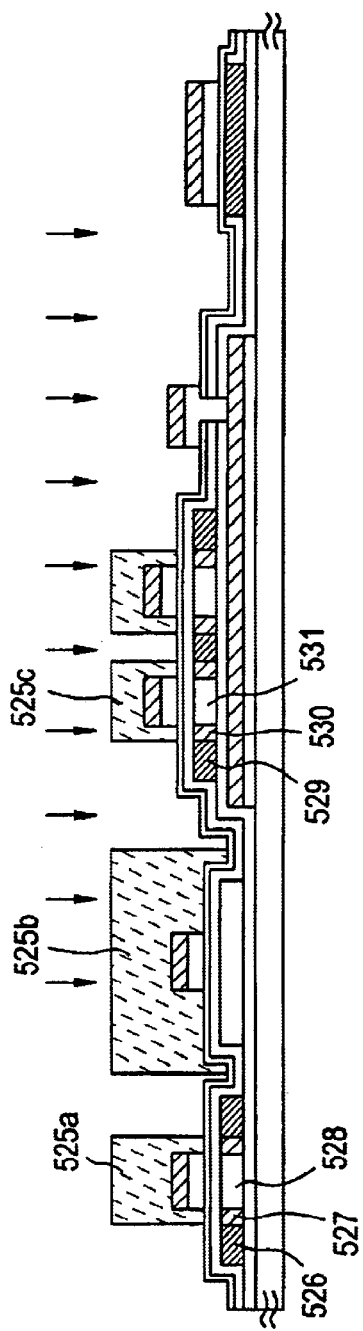
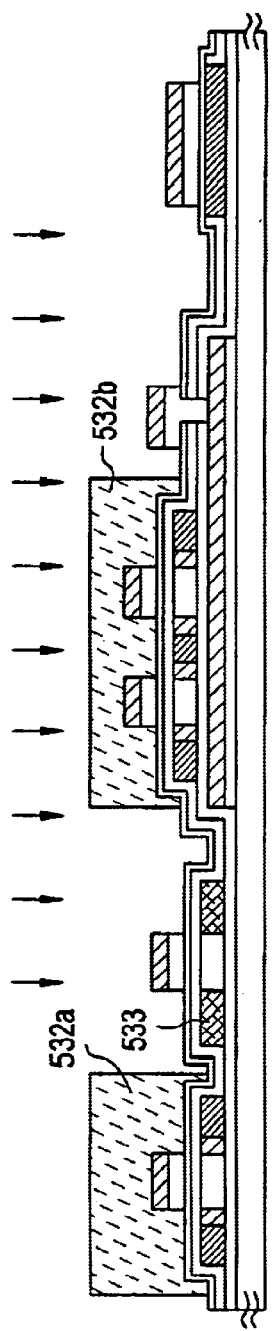
FIG. 7A
FIG. 7B
FIG. 7C

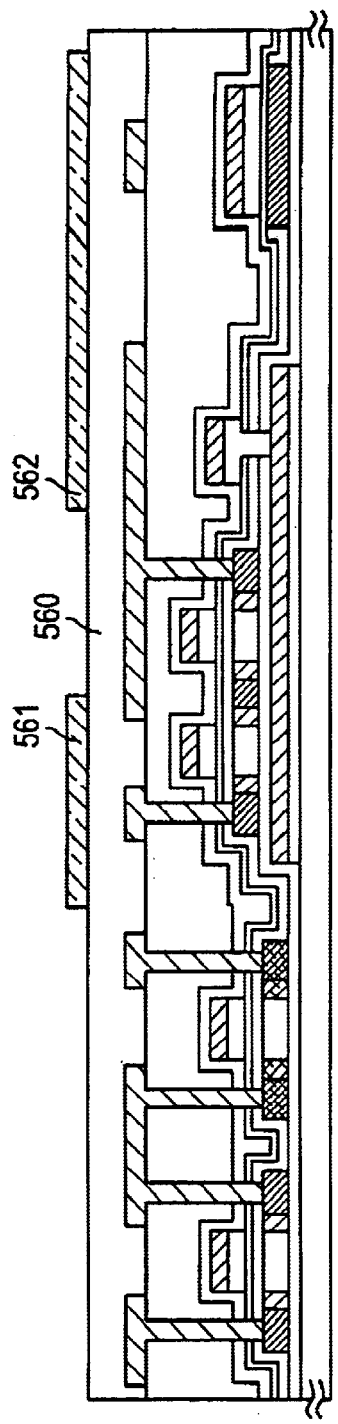
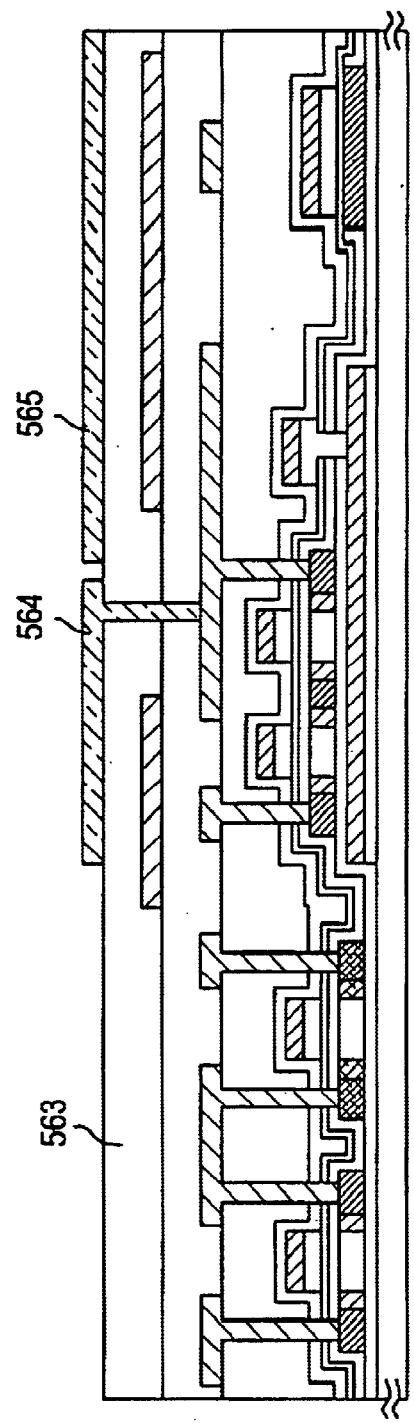
FIG. 10A
FIG. 10B

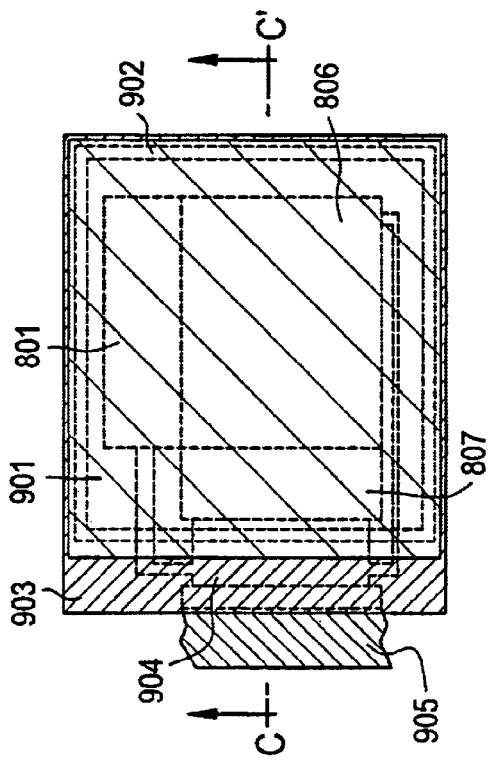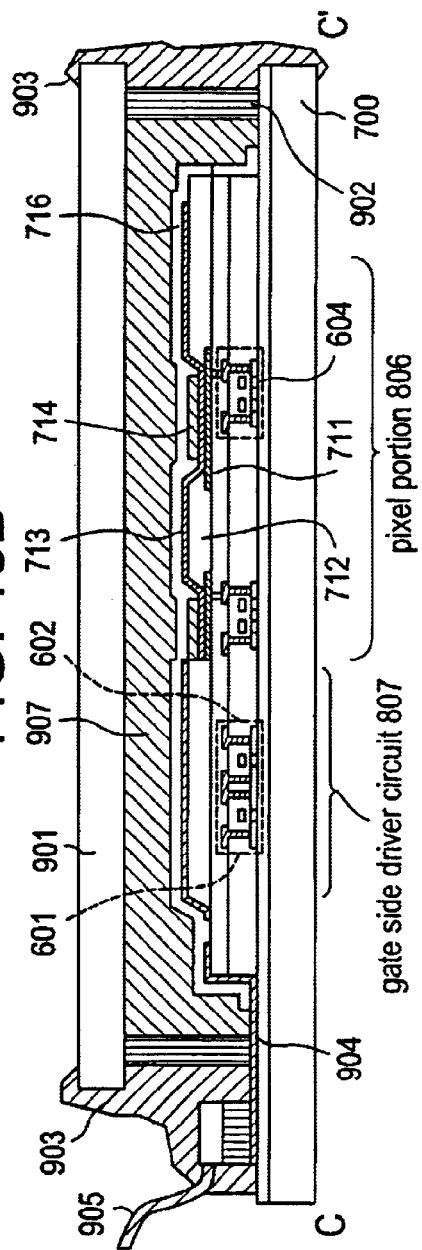

METHOD OF MANUFACTURING A SEMICONDUCTOR DEVICE HAVING A CRYSTALLIZED SEMICONDUCTOR FILM

BACKGROUND OF THE INVENTION

1. Field of the Invention

The present invention relates to a method of manufacturing a semiconductor device having circuits formed by thin film transistors (hereafter referred to as TFTs). For example, the present invention relates to electro-optical devices, typically liquid crystal display devices, and to electronic equipment in which electro-optical devices are installed as parts. Further, the present invention relates to a method of manufacturing such devices. Note that the term semiconductor device in this specification indicates a category of general devices capable of functioning by utilizing semiconductor characteristics, and the above-mentioned electro-optical devices and electronic equipment are also included in the category of semiconductor devices.

2. Description of the Related Art

Research is widespread into techniques of forming crystalline semiconductor films, and increasing crystallinity, by performing heat treatment, laser annealing, or both heat treatment and laser annealing on an amorphous semiconductor film, formed on an insulating substrate such as glass. Silicon films are often used for the semiconductor films. Note that the term crystalline semiconductor film in this specification refers to a category of semiconductor films in which crystallized regions exist, and that semiconductor films that are crystallized over their entire surface area are also included in the category of crystalline semiconductor films.

The crystalline semiconductor films have an extremely high mobility in comparison with amorphous semiconductor films. Monolithic liquid crystal electro-optical devices (semiconductor devices in which thin film transistors (TFTs) used for a pixel portion and driver circuits are manufactured on one substrate) can be therefore produced if crystalline semiconductor films are utilized, but cannot be realized, for example, by semiconductor devices manufactured by using conventional amorphous semiconductor films.

However, it is impossible to control crystal orientation, so that its arrangement has an arbitrary direction, in crystalline semiconductor films formed by using heat treatment or laser annealing (a technique of crystallizing a semiconductor film by the irradiation of laser light) to crystallize an amorphous semiconductor film deposited by plasma CVD or LPCVD. This becomes a source of limitations in the electrical characteristics of the TFTs.

EBSP (electron backscatter diffraction patterning) exists as a method of analyzing crystal orientation of the surface of a crystalline semiconductor film. The EBSP method can show the crystal orientation directed toward the surface for crystal grains at measurement points in different colors and, can distinctly display focusing upon a certain measurement point, regions within a crystal orientation deviation angle range (permissible deviation angle), set by a user making the measurements, in neighboring points. It is possible for the user to freely set the permissible deviation angle, but the permissible deviation angle is set to 15° in this specification. Regions having a crystal orientation within a range that is equal to or less than 15° between the point focused upon and its neighboring points are referred to as grains. The reason why the permissible deviation angle is set to 15° is because the set value in general is 15°. Grains are formed from a plurality of crystal grains, but can be seen macroscopically as one crystal grain because the permissible angle for crystal orientation is small.

Further, a method recorded in Japanese Patent Application Laid-open No. Hei 7-183540 can be given as one method of crystallizing an amorphous semiconductor film. A simple explanation is presented here. First, a very small amount of a metal element such as nickel, palladium, or lead is added to an amorphous semiconductor film. Methods such as plasma processing, evaporation, ion injection, sputtering, and solution application can be utilized as the addition method. After the addition, the amorphous semiconductor film is then exposed, for example, to a nitrogen atmosphere at a temperature of 550° C. for 4 hours, forming a crystalline semiconductor film. Not only can the electric field effect mobility be increased if a TFT is formed by using such the crystalline semiconductor film, but it is also possible to make the sub-threshold factor (S value) smaller, and to greatly increase the electrical characteristics. The optimal heat treatment temperature and heat treatment time for crystallization is dependent upon the amount of the metal element added and the state of the amorphous semiconductor film. Further, it has been verified that it is possible to increase the crystal orientation property in a monotonic manner by using this method of crystallization.

TFTs have been made smaller in order to provide higher integration and higher speed for present-day LSIs, and TFT size has broken through the 1 μm level. In the case where TFTs of this type are manufactured using crystalline semiconductor films formed by conventional methods of crystallization, if the crystalline semiconductor are patterned for element separation to be separated, then dispersion will develop in active regions of individual devices in that many grain boundaries will exist in some elements and other elements will be formed by almost only grains. Further, if semiconductor films are crystallized using a metal element to promote crystallization, then crystal grains formed having the metal elements as crystal nuclei are mixed with crystal grains formed by spontaneous nucleation (cases in which nucleation begins at a site other than a metal element are defined as spontaneous crystallization within this specification). Dispersion in the semiconductor film properties thus develops. Note that spontaneous nucleation is known to develop at a high temperature greater than or equal to 600° C., and when the required crystallization time is long. This dispersion is a cause of dispersion in electrical characteristics and a factor in display irregularities if the crystalline semiconductor films are used as display portions of electronic equipment.

A method of suppressing the grain dispersion in the active regions of individual devices by making the grains smaller is considered here. The crystal nucleus generation density may be increased for this method. Namely, the surface energy of the semiconductor film is reduced, and the critical nucleus radius is reduced by increasing the chemical potential of the semiconductor film. A method of adding to the semiconductor film a large amount of a metal element for promoting crystallization, thus changing the surface energy and the chemical potential of the semiconductor film, is one method of suppressing the grain dispersion. A large number of crystal nuclei are generated by the metal elements if this method is used, and the grains can be made smaller. However, there is a problem with the aforementioned method in that an excessive amount of the metal element remains as a metal compound within high resistance regions (channel forming regions and offset regions). The metal compound allows electric current to flow more easily, reducing the resistance of regions that must be high resistance regions. This becomes a problem that can harm the stability of the TFT electrical characteristics as well as the reliability.

SUMMARY OF THE INVENTION

The present invention is a technology for solving problems like those stated above. The present invention is a technique for averaging the number of grains within active regions of individual devices by making the crystalline semiconductor film grains obtained using a metal element smaller without increasing the amount of the metal element used. An object of the present invention is to achieve an increase in the operational characteristics of a semiconductor device, and an increase in its reliability, with respect to the semiconductor device and an electro-optical device, typically an active matrix liquid crystal display device, using TFTs.

The present invention is characterized in that thermal crystallization of a semiconductor film utilizing a metal element is performed after exposing the semiconductor film to a plasma atmosphere. As already discussed, the density of crystal nuclei can be increased, if the critical nucleus radius is made smaller and the surface energy and the chemical potential of the semiconductor film are changed by some type of method. In the present invention, the chemical potential of the semiconductor film is increased, and the density of crystal nuclei generated by the metal element is increased, by performing exposure of the semiconductor film to an atmosphere that has been made into a plasma. If the density of crystal nuclei generated is increased, the amount of time required for crystallization is shortened, and it becomes possible to suppress spontaneous nucleation. The crystalline semiconductor films are embedded into crystal grains that grow with the metal elements as crystal nuclei, and it becomes possible to reduce the grain size with crystalline semiconductor films thus formed. Heat treatment may also be performed after exposing the semiconductor film, to which the metal element has been added, to the plasma atmosphere.

In addition, laser annealing may be performed to improve the crystallinity after exposing the semiconductor film to the atmosphere in which a gas is turned into a plasma and performing thermal crystallization using the metal element, or after exposing the crystalline semiconductor film added with metal element to the plasma atmosphere. It is possible to perform sufficient laser annealing without laser annealing becoming a cause of surface roughness, even if the semiconductor film is exposed to the plasma atmosphere before laser annealing is performed.

According to a structure of the present invention, there is provided a method of manufacturing a semiconductor device comprising the steps of:

exposing a semiconductor film to a plasma of a gas selected from the group consisting of an inert gas, nitrogen, and ammonia;

providing the semiconductor film with a metal containing material; and crystallizing the semiconductor film by heating after providing the metal containing material.

Films such as amorphous semiconductor films and microcrystalline semiconductor films exist as the semiconductor film in each of the aforementioned structures, and chemical compound semiconductor films having an amorphous structure, such as amorphous silicon films and amorphous silicon germanium films may be applied.

Further, a plasma generation apparatus can be used in order to expose the semiconductor film to the gas plasma atmosphere for the above structures. It is preferable to use a plasma CVD apparatus or a dry etching apparatus as the plasma generation apparatus.

Further, the atmosphere may be an atmosphere having as its main constituent one or a plurality of elements selected from the group consisting of inert gas elements and nitrogen. It is possible to perform sufficient laser annealing even if laser annealing is performed after exposing the semiconductor film to the plasma atmosphere having such elements, for example, without laser annealing becoming a cause of surface roughness. Further, these elements exert no influence on the semiconductor characteristics, even if they exist within the semiconductor film. The semiconductor film may also be exposed to an atmosphere in which ammonia has been made into a plasma.

Further, in the above-mentioned manufacturing processes, the metal element is one element or a plurality of elements selected from the group consisting of Fe, Co, Ni, Ru, Rh, Pd, Os, Ir, Pt, Cu, Ag, Au, Al, In, Sn, Pb, P, As, and Sb.

Further, according to another structure of the present invention, there is provided a method of manufacturing a semiconductor device comprising the steps of:

providing a metal containing material to a semiconductor film;

exposing the semiconductor film to a plasma of a gas selected from the group consisting of an inert gas element, nitrogen, and ammonia, after providing the metal containing material; and crystallizing the semiconductor film by heating after exposing the semiconductor film.

Films such as amorphous semiconductor films and microcrystalline semiconductor films exist as the semiconductor film in each of the aforementioned structures, and chemical compound semiconductor films having an amorphous structure, such as amorphous silicon films and amorphous silicon germanium films may be applied.

Further, a plasma generation apparatus can be used in order to expose the semiconductor film to the gas plasma atmosphere for the above structures. It is preferable to use a plasma CVD apparatus or a dry etching apparatus as the plasma generation apparatus.

Further, the atmosphere may be an atmosphere having as its main constituent one or a plurality of elements selected from the group consisting of inert gas elements and nitrogen. It is possible to perform sufficient laser annealing even if laser annealing is performed after exposing the semiconductor film to the plasma atmosphere having such elements, for example, without laser annealing becoming a cause of surface roughness. Further, these elements exert no influence on the semiconductor characteristics, even if they exist within the semiconductor film. The semiconductor film may also be exposed to an atmosphere in which ammonia has been made into a plasma.

Further, in the above-mentioned manufacturing processes, the metal element is one element or a plurality of elements selected from the group consisting of Fe, Co, Ni, Ru, Rh, Pd, Os, Ir, Pt, Cu, Ag, Au, Al, In, Sn, Pb, P, As, and Sb.

The density of crystal nuclei generated by the metal elements can be increased, and dispersion in the semiconductor film properties can be reduced by applying the present invention as described above, and therefore semiconductor device performance can be greatly increased. For example, the number of grain boundaries contained in channel forming regions of TFTs can be made uniform. It therefore becomes possible to reduce dispersion in the on current value (the value of the drain current flowing when the TFT is in an on state), the off current value (the value of the drain current flowing when the TFT is in an off state), the threshold value voltage, the S value, and the electric field effect mobility. Further, crystallization becomes possible in a short amount of time, and therefore the amount of processing time can be shortened, and cost reductions can be achieved.

In addition, it becomes possible to make the number of grains in the active regions of individual devices uniform by making the grains smaller. It also becomes possible to reduce dispersion in the electrical characteristics, and reduce display irregularities when using the TFTs as display portions in all types of semiconductor devices.

BRIEF DESCRIPTION OF THE DRAWINGS

In the accompanying drawings:

FIGS. 7A to 7C are cross sectional diagrams showing'the method of manufacturing pixel TFTs and driver circuit TFTs;

FIGS. 10A and 10B are cross sectional diagrams showing a method of manufacturing pixel TFTs and driver circuit TFTs;

FIG. 13A is an upper surface diagram of a light emitting device;

FIG. 13B is a cross sectional structure diagram of driver circuits and a pixel portion of the light emitting device;

DETAILED DESCRIPTION OF THE PREFERRED EMBODIMENTS

Embodiment Mode

An embodiment mode of the present invention is explained using the cross sectional diagrams of FIGS. 1A to 1D.

Figure 1A:
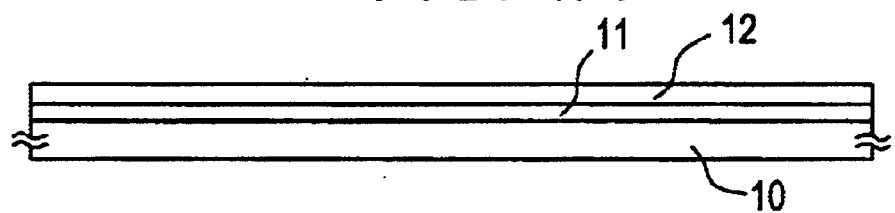
FIGS. 1A to 1D are diagrams showing an example of a structure disclosed by the present invention.
Figure 1B:
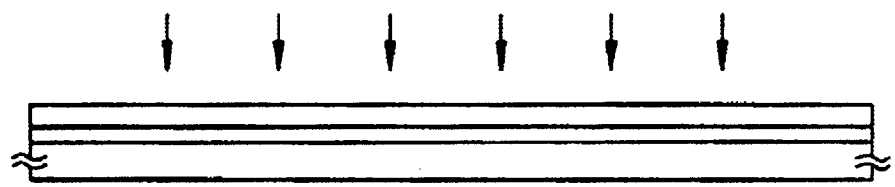
Figure 1C:
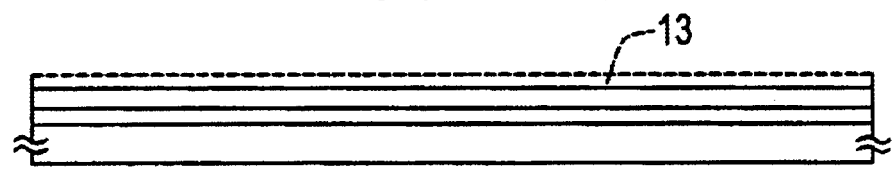
Figure 1D:
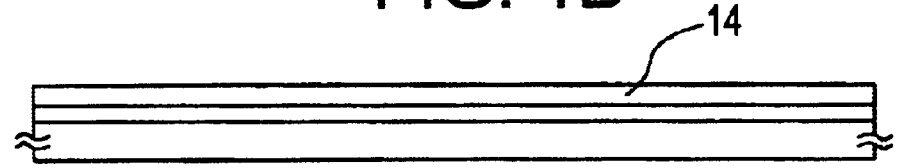

A synthesized quartz glass substrate, and non-alkaline glass substrates such as barium borosilicate glass substrates and aluminum borosilicate glass substrates may be used for a substrate 10 in FIG. 1A. For example, Corning Corp. #7059 glass, #1737 glass, and the like can be applied preferably. Further, plastic substrates having heat resistant properties capable of withstanding the processing temperatures of this embodiment mode may also be used.

A base insulating film 11 is formed by a known means (such as LPCVD or plasma CVD) on the substrate 10 from a film such as a silicon nitride film, a silicon oxynitride film, or a silicon oxide film. The base insulating film 11 need not be formed, of course.

Next, a semiconductor film 12 is formed to a thickness of 10 to 200 nm (preferably between 30 and 100 nm) by a known means such as plasma CVD or sputtering. Amorphous semiconductor films, microcrystalline semiconductor films, and the like exist as the semiconductor films 12, and compound semiconductor films having an amorphous structure such as amorphous silicon germanium films may also be applied as the semiconductor film 12.

The semiconductor film 12 is then exposed to an atmosphere in which a gas, having as its main constituent one or a plurality of members selected from the group consisting of inert gas elements, nitrogen, and ammonia, is processed into a plasma. A plasma generation apparatus (such as a plasma CVD apparatus or a dry etching apparatus) is used in order to turn the gas having such elements into a plasma, and the exposure of the semiconductor film is performed for 30 seconds to 20 minutes (preferably from 3 to 5 minutes). In addition, it is preferable to perform processing while setting the gas flow rate to from 50 to 300 sccm, the substrate temperature from 200 to 500° C., and an RF power from 100 to 400 W.

The semiconductor film 12 is crystallized next by a thermal annealing method using a metal element such as nickel. First, a layer containing a metal element for promoting crystallization (a metal containing layer 13) is formed. As the metal elements, one or a plurality of elements selected from the group consisting of Fe, Co, Ni. Ru, Rh, Pd, Os, Ir, Pt, Cu, Ag, Au, Al, In, Sn, Pb, P, As, and Sb, may be used. Methods such as plasma processing, evaporation, ion injection, sputtering, and solution application may be utilized as an addition method for the metal element.

Exposure to the atmosphere in which the gas, having as its main constituent one or a plurality of members selected from the group consisting of inert gas elements, nitrogen, and ammonia, is processed into a plasma may of course also be performed after forming the metal containing layer 13 on the semiconductor film 12.

Heat treatment processing is then utilized, performing crystallization of the semiconductor film 12 The heat treatment process is performed by thermal annealing using an annealing furnace. Thermal annealing may be performed for 4 to 12 hours at a temperature of 400 to 700° C., typically between 500 and 550° C., within a nitrogen atmosphere having an oxygen concentration equal to or less than 1 ppm, preferably equal to or less than 0.1 ppm. Further, methods such as laser annealing and rapid thermal annealing (RTA) may be used as other heat treatment processes instead of thermal annealing.

Crystallization of the semiconductor film can also be performed in combination with a known crystallization method other than thermal annealing using a metal element (such as laser crystallization).

Grains in crystalline semiconductor films thus formed are small, and in particular are suitable for manufacturing sub-micron devices. Furthermore, dispersion in the electrical characteristics is reduced, and it is possible to suppress display irregularities when using the semiconductor films as display portions for all types of semiconductor devices.

The present invention, structured as stated above, is explained in additional detail by the embodiments shown below.

Embodiments

Embodiment 1

An embodiment of the present invention is explained using the cross sectional diagrams of FIGS. 1A to 1D.

A synthesized quartz glass substrate, and non-alkaline glass substrates such as barium borosilicate glass substrates and aluminum borosilicate glass substrates may be used for a substrate 10 in FIG. 1A. For example, Corning Corp. #7059 glass, #1737 glass, and the like can be applied preferably. Further, plastic substrates having heat resistant properties capable of withstanding the processing temperatures of this embodiment may also be used. A synthesized quartz glass substrate is applied in Embodiment 1.

A base insulating film 11 is formed by a known means (such as LPCVD or plasma CVD) on the substrate 10 from a film such as a silicon nitride film, a silicon oxynitride film, or a silicon oxide film. A 150 nm thick silicon oxynitride film (composition ratio: Si=32%, O=27%, N=24%, H=17%) is formed as the base insulating film in Embodiment 1.

Next, a semiconductor film 12 is formed to a thickness of 10 to 200 nm (preferably between 30 and 100 nm) by a known means such as plasma CVD or sputtering. Amorphous semiconductor films, microcrystalline semiconductor films, and the like exist as the semiconductor films 12, and compound semiconductor films having an amorphous structure such as amorphous silicon germanium films may also be applied as the semiconductor film 12. A 55 nm thick amorphous silicon film is formed using LPCVD in Embodiment 1.

The semiconductor film 12 is then exposed to an atmosphere in which a gas, having as its main constituent one or a plurality of members selected from the group consisting of inert gas elements, nitrogen, and ammonia, is processed into a plasma. A plasma generation apparatus (such as a plasma CVD apparatus or a dry etching apparatus) is used in order to turn the gas having such elements into a plasma, and the exposure of the semiconductor film is performed for 30 seconds to 20 minutes (preferably from 3 to 5 minutes). In addition, it is preferable to perform processing while setting the gas flow rate to from 50 to 300 sccm, the substrate temperature from 200 to 500° C., and an RF power from 100 to 400 W. Processing is performed in Embodiment 1 by a dry etching apparatus using Ar, with a gas flow rate of 100 sccm, an RF power of 200 W, and a substrate temperature set to 400° C.

The semiconductor film 12 is crystallized next by thermal annealing using a metal element such as nickel. First, a layer containing a metal element in order to promote crystallization (the metal containing layer 13) is formed. Metal elements such as nickel, palladium, and lead may be used as the metal element, and methods such as plasma processing, evaporation, ion injection, sputtering, and solution application may be applied as a method of adding the metal element. An aqueous nickel acetate solution (per weight concentration 5 ppm, volume 10 ml) is applied to the surface of the amorphous silicon film by spin coating to form a metal containing layer in Embodiment 1.

Heat treatment processing is then utilized, performing crystallization of the semiconductor film 12. The heat treatment process is performed by thermal annealing using 10 an annealing furnace. Thermal annealing may be performed for 4 to 12 hours at a temperature of 400 to 700° C., typically between 500 and 550° C., within a nitrogen atmosphere having an oxygen concentration equal to or less than 1 ppm, preferably equal to or less than 0.1 ppm. Further, methods such as laser annealing and rapid thermal annealing (RTA) may be used as other heat treatment processes instead of thermal annealing. Heat treatment (at 550° C. for 4 hours) is performed in Embodiment 1, forming a crystalline silicon film.

Crystallization of the semiconductor film can also be performed in combination with a known crystallization method other than thermal annealing using a metal element (such as laser crystallization).

Grains in crystalline semiconductor films thus formed are small, and in particular are suitable for manufacturing sub-micron devices. Furthermore, dispersion in the electrical characteristics is reduced, and it is possible to suppress display irregularities when using the semiconductor films as display portions for all types of semiconductor devices.

Embodiment 2

In order to verify the effectiveness of the present invention, an experiment was performed as discussed below using Ar from among elements capable of being used in making a plasma (such as inert gas elements and ammonia).

A synthesized quartz glass substrate was used as the substrate 10 in FIG. 1A, and an amorphous silicon film was formed to a film thickness of 65 nm on the substrate by using an LPCVD apparatus. Test pieces of this type were then either exposed to an atmosphere in which Ar had been made into a plasma, or were not exposed thereto. The exposure conditions for the Ar plasma atmosphere are a gas flow rate of 100 sccm, an RF power of 200 W, and a substrate temperature of 400° C. in a plasma CVD apparatus.

An aqueous nickel acetate solution (per weight concentration 5 ppm, volume 10 ml) is next applied to the surface of the amorphous silicon film by spin coating, forming a metal containing layer, and heat treatment is performed (for 12 hours at 600° C.), performing crystallization of the semiconductor film.

Figure 2:
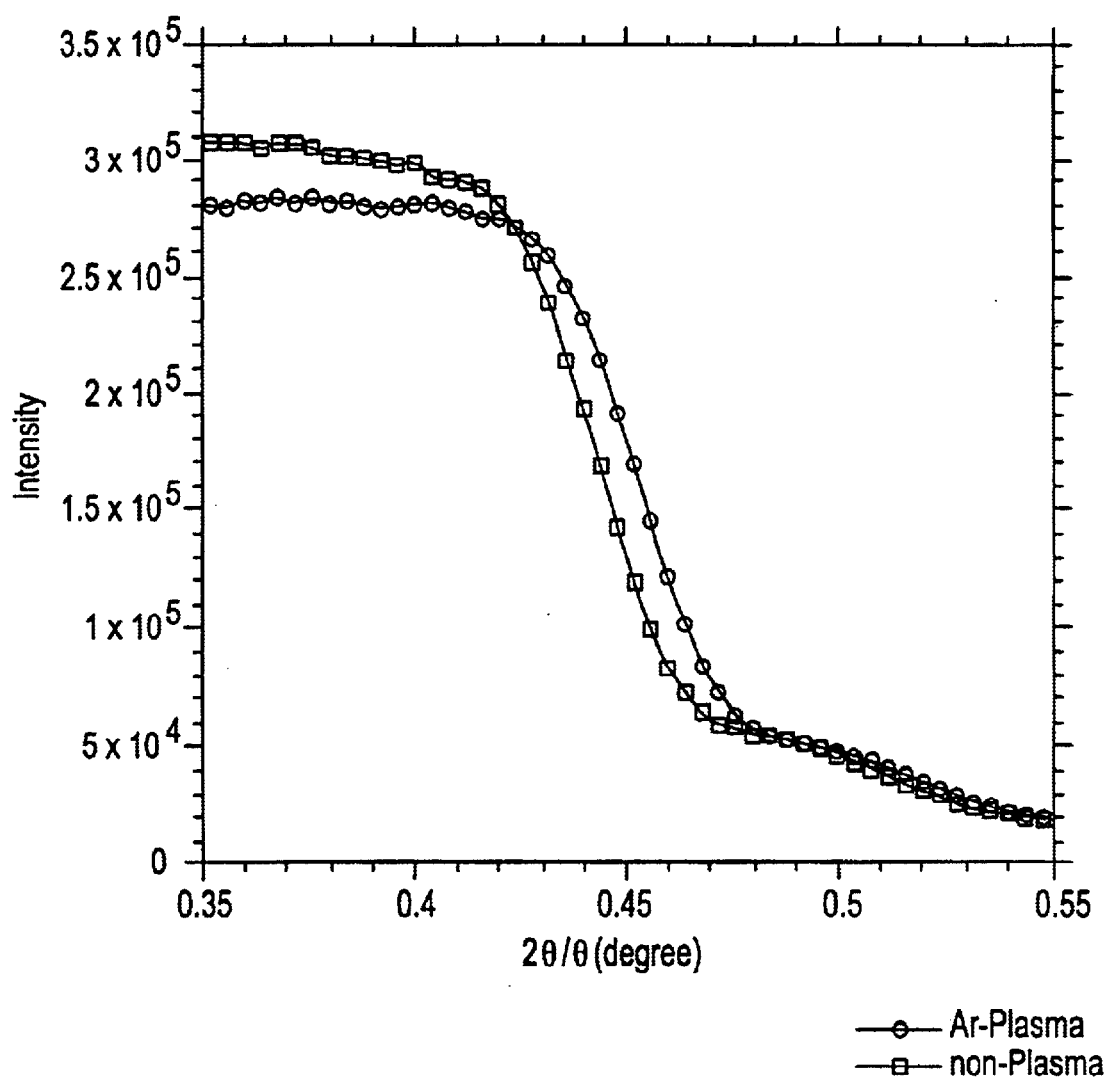
FIG. 2 is a diagram showing the results of measuring x-ray reflectivity in order to verify the effectiveness of the present invention.
Figure 3A:
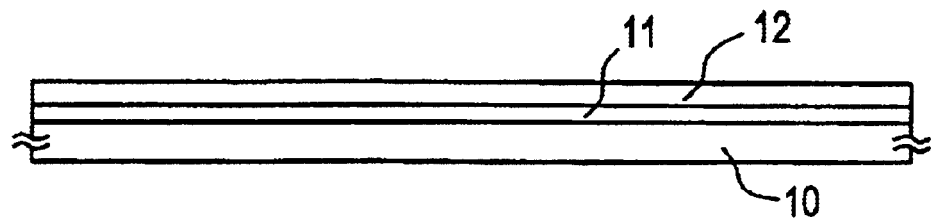
FIGS. 3A to 3D are diagrams showing an example of a structure disclosed by the present invention.
Figure 3B:
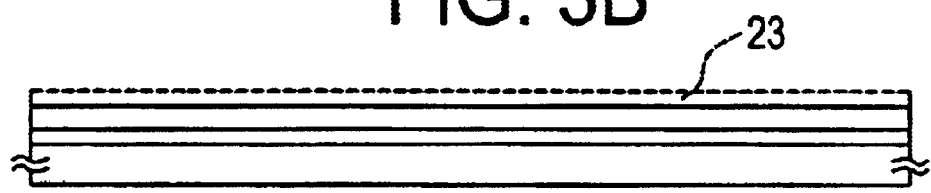
Figure 3C:
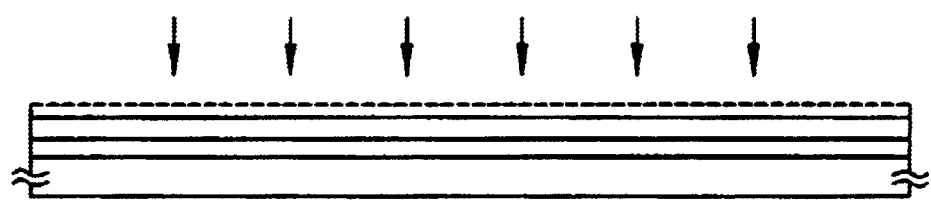
Figure 3D:
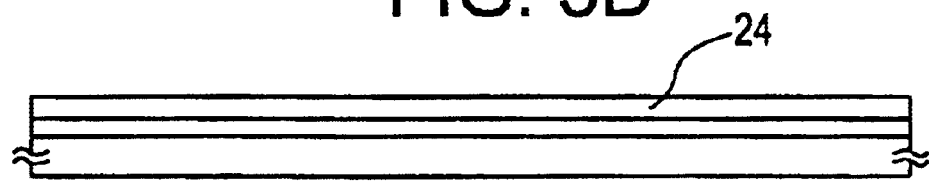

X-ray reflectivity measurements were then performed on the test pieces thus manufactured, and the results are shown in FIG. 2. Under each of the test conditions, the intensity falls rapidly after initially maintaining a fixed value. The surface density of the amorphous silicon can be found by taking an angle θ at this time as a critical angle. The results show that the semiconductor film density is 2.35 g/cm$^3$ if the semiconductor film is exposed to the Ar plasma atmosphere, and 2.24 g/cm$^3$ when not exposed. In other words, the surface density of the amorphous silicon increases if plasma processing is performed. Thereby, it can be seen that nucleation becomes easy and a crystal nucleus generation density increases. Therefore, the effectiveness of the present invention can be confirmed.

Figure 17A:
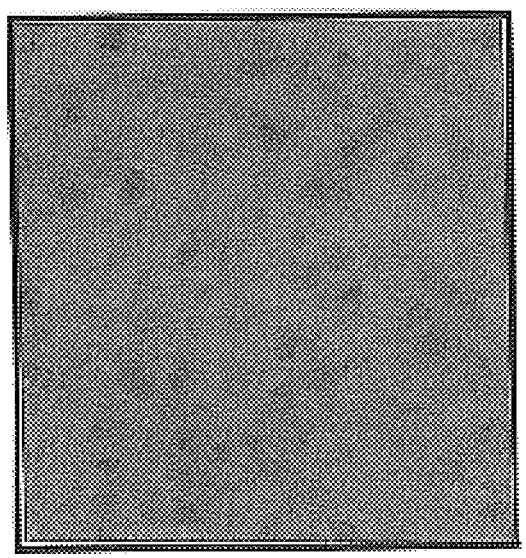
FIGS. 17A and 17B are diagrams showing the results of surface examination by optical microscope in order to confirm the effectiveness of the present invention.
Figure 17B:
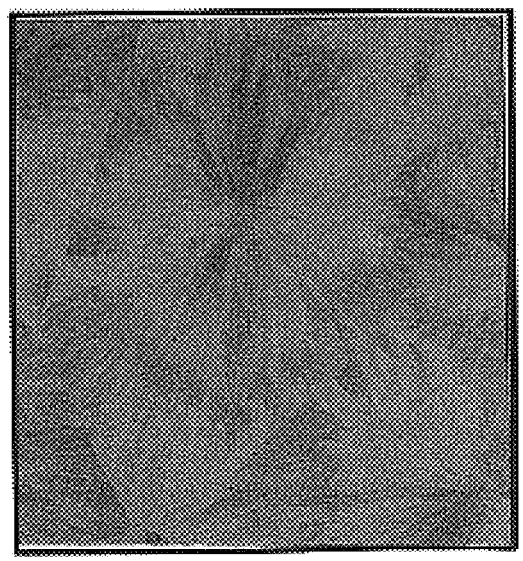
Figure 18A:
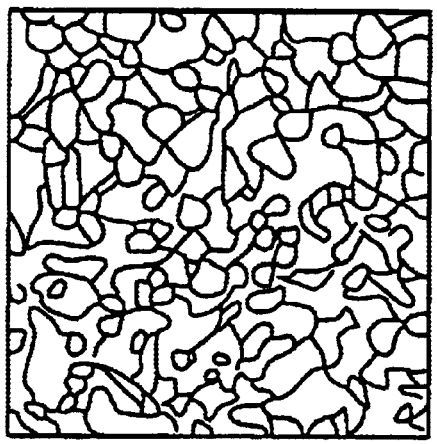
FIGS. 18A and 18B are schematic diagrams showing the results of surface examination by optical microscope in order to confirm the effectiveness of the present invention.
Figure 18B:
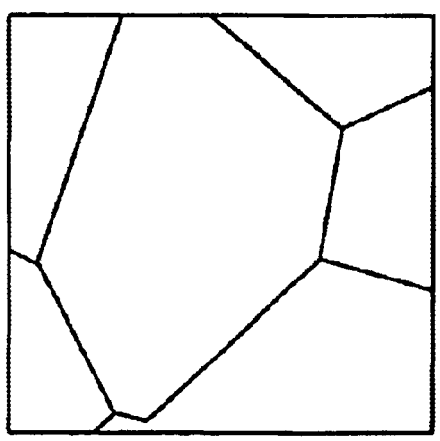

Further, an oxide film is removed by immersing the test pieces for 30 seconds in a 0.5% hydrofluoric acid solution. In addition, anisotropic etching is performed by immersing the test pieces in a KOH/IPA solution for 30 seconds. The anisotropic etching makes it possible to observe crystal orientation in the grains, as well as grain boundaries, by an optical microscope. The surfaces of the test pieces were observed here by using an optical microscope (bright field reflection mode, 200× magnification) after performing the anisotropic etching, and the results are shown in FIGS. 17A and 17B. FIG. 17A is a photograph showing the results when Ar plasma exposure is performed, and FIG. 17B is a photograph showing the results when Ar plasma exposure is not performed. Further, FIGS. 18B and 18A are schematic diagrams of FIGS. 17B and 17A, respectively. It can be seen that the grain is smaller in FIGS. 17A and 18A compared to grain size of FIGS. 17B and 18B. The grain boundaries in FIGS. 17A and 18A are vague as compared with those of FIGS. 17B and 18B, and it is thought that the reason for this is that the grain size is small, and that overlapping develops with the small grains.

It can thus be verified that the grains of crystalline semiconductor films obtained using the present invention are small. The crystalline semiconductor films are particularly suited for the manufacture of sub-micron devices. Further, dispersion in the electrical characteristics is reduced, and this makes it possible to suppress display irregularities when the crystalline semiconductor films are used as display portions for all types of semiconductor devices.

Embodiment 3

An embodiment of the present invention is explained on results obtained by measuring electrical characteristics of TFTs manufactured by using crystalline semiconductor films. One of the crystalline semiconductor film is crystallized before plasma processing is performed in accordance with Embodiment 2, and the other is crystallized without the plasma processing. Note that the TFTs are manufactured in the same manner as Embodiment 6 except for step of crystallizing.

Figure 19A:
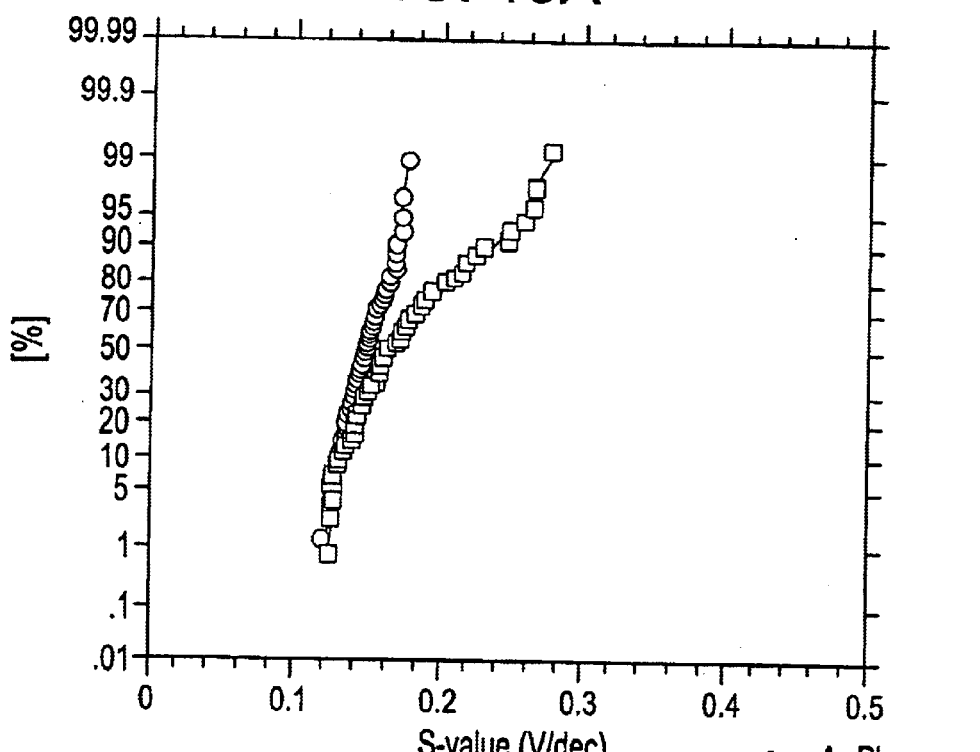
FIG. 19A shows a probability statistical distribution diagram with respect to the S value and FIG. 19B shows a probability statistical distribution diagram with respect to the electric field effect mobility.
Figure 19B:
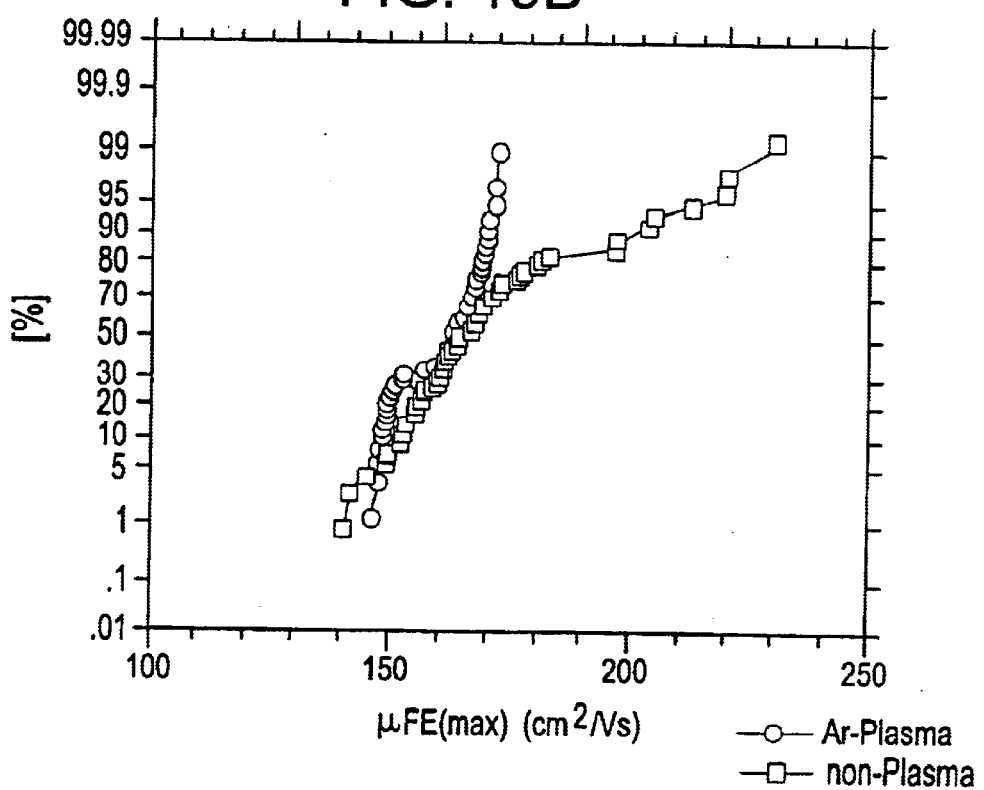

FIG. 19A shows a probability statistical distribution diagram with respect to the S value and FIG. 19B shows a probability statistical distribution diagram with respect to the electric field effect mobility. N-channel TFTs with channel forming region lengths/widths 50/50 μm are measured in FIGS. 19A and 19B. The axis of abscissas indicates the electrical characteristic and the axis of ordinates indicates the probability distribution in FIGS. 19A and 19B. The more the probability distribution is parallel with the axis of ordinates, the smaller the dispersion is. FIGS. 19A and 19B show that the dispersion is smaller when Ar plasma is performed compared with when Ar plasma is not performed.

As described the above, it is shown that the dispersion of the electrical characteristic is reduced in the case of manufacturing the TFTs by using the crystalline semiconductor film of the present invention Further, dispersion in the electrical characteristics is reduced, and this makes it possible to suppress display irregularities when the crystalline semiconductor films are used as display portions for each type of semiconductor devices.

Embodiment 4

A method of manufacture differing from that of Embodiment 1 is explained in Embodiment 4 using the cross sectional diagrams of FIGS. 3A to 3D.

First, processing is performed in accordance with Embodiment 1 up through FIG. 1A. Note that the same reference symbols are used in FIG. 3A for portions that correspond to those of FIG. 1A.

The semiconductor film 12 is crystallized next by thermal annealing using a metal element such as nickel. First, a layer containing a metal element in order to promote crystallization (the metal containing layer 13) is formed. Metal elements such as nickel, palladium, and lead may be used as the metal element, and methods such as plasma processing, evaporation, ion injection, sputtering, and solution application may be applied as a method of adding the metal element. Nickel is introduced by sputtering in Embodiment 4, forming the metal containing layer.

The semiconductor film 12 is then exposed to an atmosphere in which a gas, having as its main constituent one or a plurality of members selected from the group consisting of inert gas elements, nitrogen, and ammonia, is processed into a plasma. A plasma generation apparatus (such as a plasma CVD apparatus or a dry etching apparatus) is used in order to turn the gas having such elements into a plasma, and the exposure of the semiconductor film is performed for 30 seconds to 20 minutes (preferably from 3 to 5 minutes). In addition, it is preferable to perform processing while setting the gas flow rate to from 50 to 300 sccm, the substrate temperature from 200 to 500° C., and an RF power from 100 to 400 W. Processing is performed in Embodiment 4 by a dry etching apparatus using nitrogen, with a gas flow rate of 100 sccm, an RF power of 200 W, and a substrate temperature set to 400° C.

Heat treatment processing is then utilized, performing crystallization of the semiconductor film 12. The heat treatment process is performed by thermal annealing using an annealing furnace. Thermal annealing may be performed for 4 to 12 hours at a temperature of 400 to 700° C., typically between 500 and 550° C., within a nitrogen atmosphere having an oxygen concentration equal to or less than 1 ppm, preferably equal to or less than 0.1 ppm. Further, methods such as laser annealing and rapid thermal annealing (RTA) may be used as other heat treatment processes instead of thermal annealing. Heat treatment (at 550° C. for 4 hours) is performed in Embodiment 4, forming a crystalline silicon film. Grains in crystalline semiconductor films thus formed are small, and in particular are suitable for manufacturing sub-micron devices. Furthermore, dispersion in the electrical characteristics is reduced, and it is possible to suppress display irregularities when using the semiconductor films as display portions for all types of semiconductor devices.

Embodiment 5

An Embodiment of the present invention is explained using FIGS. 4A to 4D.

Figure 4A:
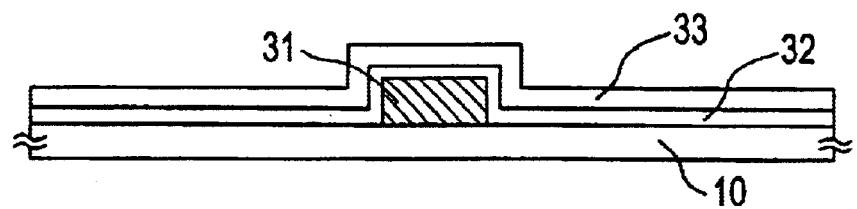
FIGS. 4A to 4D are diagrams showing an example of a structure disclosed by the present invention.
Figure 4B:
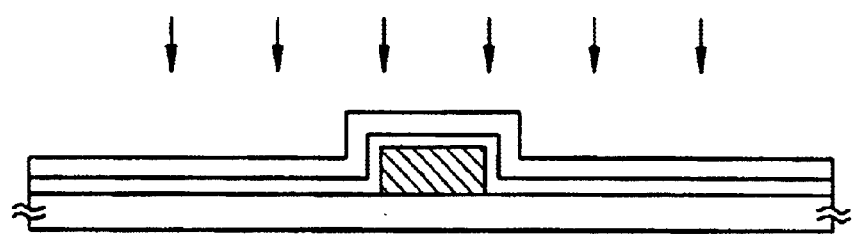
Figure 4C:
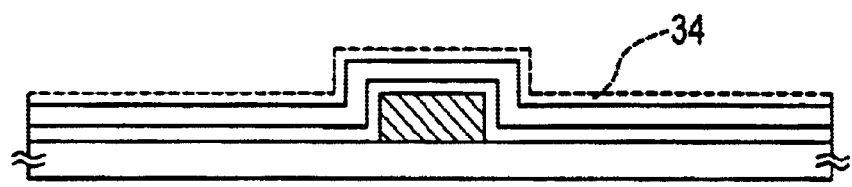
Figure 4D:
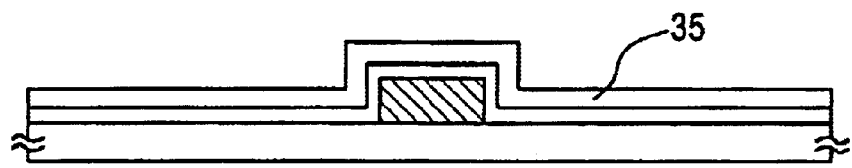
Figure 5A:
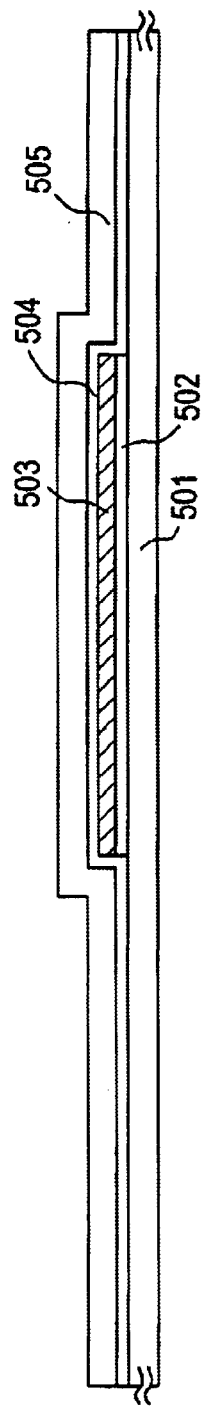
FIGS. 5A to 5D are cross sectional diagrams showing a method of manufacturing pixel TFTs and driver circuit TFTs.
Figure 5B:
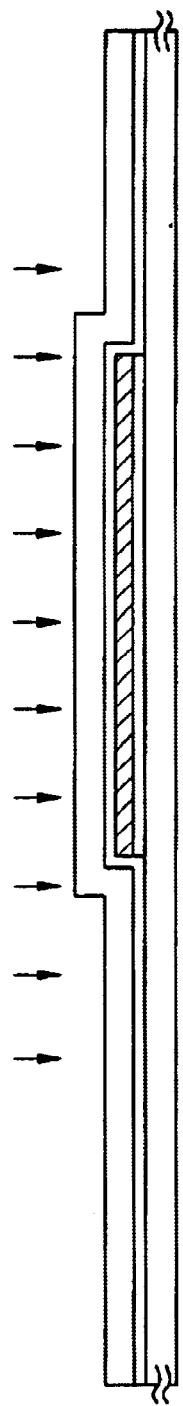
Figure 5C:
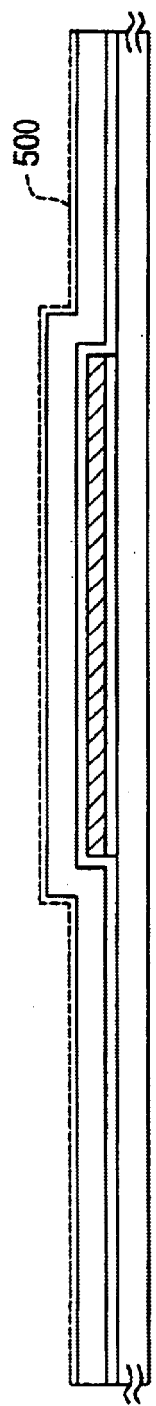
Figure 5D:
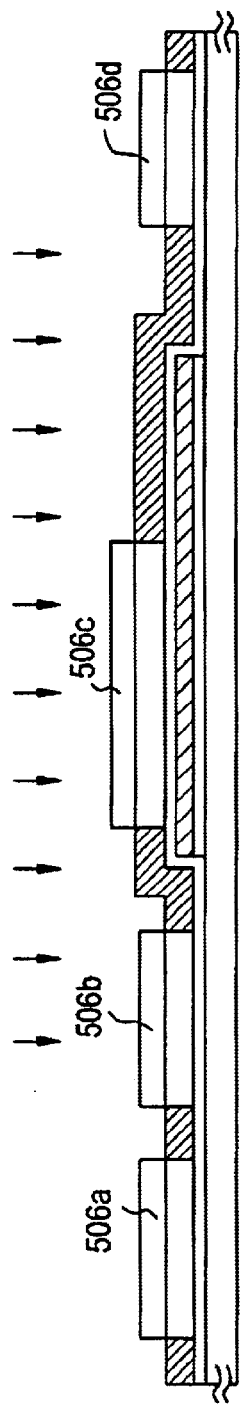
Figure 6A:
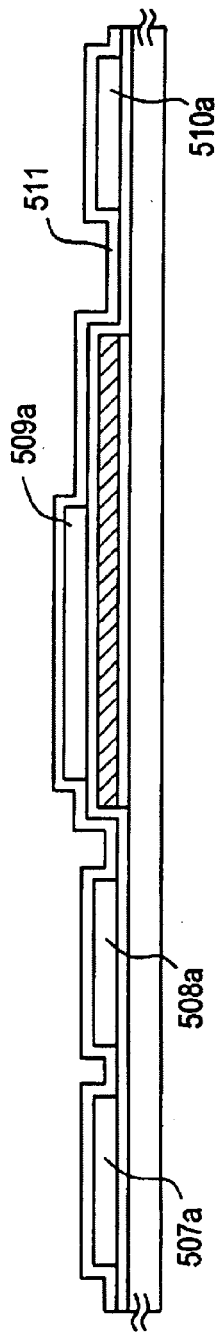
FIGS. 6A to 6D are cross sectional diagrams showing the method of manufacturing pixel TFTs and driver circuit TFTs.
Figure 6B:
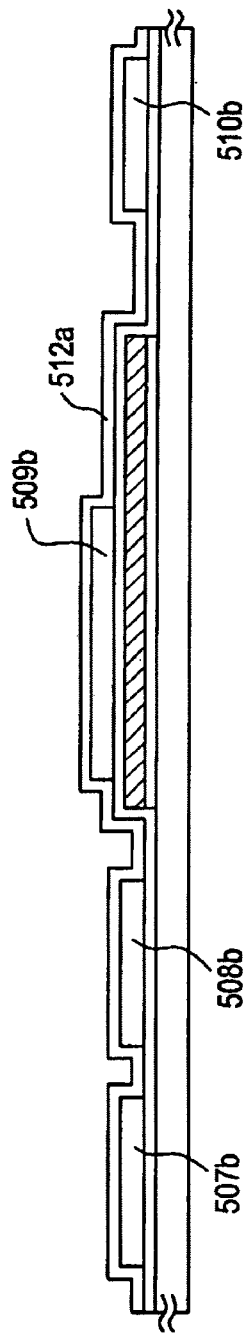
Figure 6C:
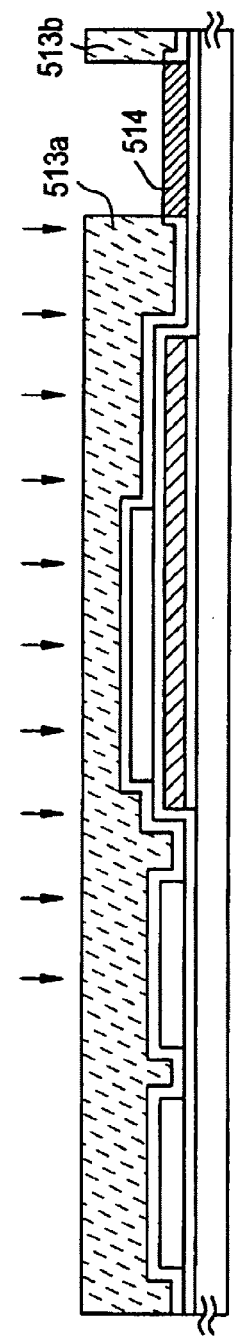
Figure 6D:
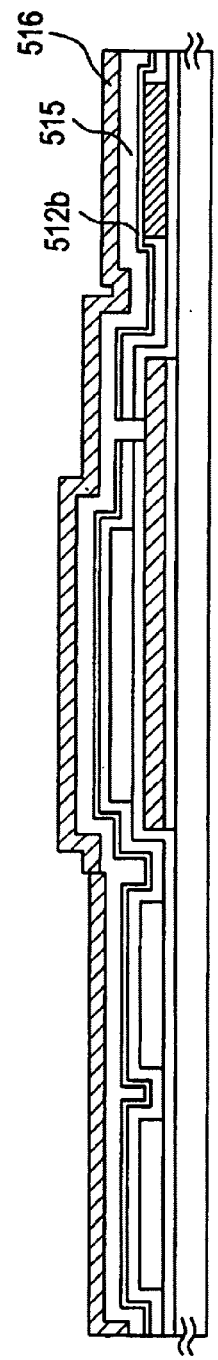

A synthesized quartz glass substrate, and non-alkaline glass substrates such as barium borosilicate glass substrates and aluminum borosilicate glass substrates may be used for a substrate 10 in FIG. 4A. For example, Corning Corp. #7059 glass, #1737 glass, and the like can be applied preferably. Further, plastic substrates having heat resistant properties capable of withstanding the processing temperatures of this embodiment may also be used.

A conductive film is formed and etching is performed, forming a conductive film 31 in a predetermined shape. There are no particular limitations placed on the conductive film material, but a material having heat resistance properties is used. The conductive film 31 may be formed from an element selected from the group consisting of Ta, W, Ti, Mo, Cu, Cr, and Nd, or from an alloy material or a chemical compound having one of these elements as its main constituent. Further, a semiconductor film, typically a crystalline silicon film, into which an impurity element such as phosphorous is doped may also be used, as may an AgPdCu alloy. The conductive film may be a single layer or may be formed by using a laminate structure. The conductive film 31 is formed from a W film having a film thickness of 400 nm in Embodiment 5.

An insulating film 32 is formed by a known means (such as LPCVD or plasma CVD) on the substrate 10 from a film such as a silicon nitride film, a silicon oxynitride film, or a silicon oxide film. A 150 nm thick silicon oxynitride film (composition ratio: Si=32%, O=27% N=24%, H=17%) is formed as a base insulating film in Embodiment 5.

Next, a semiconductor film 33 is formed to a thickness of 10 to 200 nm (preferably between 30 and 100 nm) by a known means such as plasma CVD or sputtering. Amorphous semiconductor films, microcrystalline semiconductor films, and the like exist as the semiconductor films 33, and compound semiconductor films having an amorphous structure such as amorphous silicon germanium films may also be applied as the semiconductor film 33. A 55 nm thick amorphous silicon film is formed using LPCVD in Embodiment 5.

The semiconductor film 33 is then exposed to an atmosphere in which a gas, having as its main constituent one or a plurality of members selected from the group consisting of inert gas elements, nitrogen, and ammonia, is processed into a plasma. A plasma generation apparatus (such as a plasma CVD apparatus or a dry etching apparatus) is used in order to turn the gas having such elements into a plasma, and the exposure of the semiconductor film is performed for 30 seconds to 20 minutes (preferably from 3 to 5 minutes) In addition, it is preferable to perform processing while setting the gas flow rate to from 50 to 300 sccm, the substrate temperature from 200 to 500° C., and an RF power from 100 to 400 W. Processing is performed in Embodiment 5 by a dry etching apparatus using Ar, with a gas flow rate of 100 sccm, an RF power of 200 W, and a substrate temperature set to 400° C.

The semiconductor film 33 is crystallized next by thermal annealing using a metal element such as nickel. First, a layer containing a metal element in order to promote crystallization (the metal containing layer 34) is formed. Metal elements such as nickel palladium, and lead may be used as the metal element, and methods such as plasma processing evaporation, ion injection, sputtering, and solution application may be applied as a method of adding the metal element An aqueous nickel acetate solution (per weight concentration 5 ppm, volume 10 ml) is applied to the surface of the amorphous silicon film by spin coating to form a metal containing layer in Embodiment 5.

Heat treatment processing is then utilized, performing crystallization of the semiconductor film 33. The heat treatment process is performed by thermal annealing using an annealing furnace. Thermal annealing may be performed for 4 to 12 hours at a temperature of 400 to 700° C., typically between 500 and 550° C., within a nitrogen atmosphere having an oxygen concentration equal to or less than 1 ppm, preferably equal to or less than 0.1 ppm. Further, methods such as laser annealing and rapid thermal annealing (RTA) may be used as other heat treatment processes instead of thermal annealing. Heat treatment (at 550° C. for 4 hours) is performed in Embodiment 5, forming a crystalline silicon film.

Crystallization of the semiconductor film can also be performed in combination with a known crystallization method other than thermal annealing using a metal element (such as laser crystallization).

Grains in crystalline semiconductor films thus formed are small, and in particular are suitable for manufacturing sub-micron devices. Furthermore, dispersion in the electrical characteristics is reduced, and it is possible to suppress display irregularities when using the semiconductor films as display portions for all types of semiconductor devices.

Embodiment 6

A method of manufacturing an active matrix substrate is explained in Embodiment 6 using FIGS. 5A to 10B. A substrate on which driver circuits, and a pixel portion having pixel TFTs and storage capacitors are formed is referred to as an active matrix substrate in Embodiment 6, for convenience.

First, a substrate made from glass, such as barium borosilicate glass or aluminum borosilicate glass, typically Corning Corp. #7059 glass, #1737 glass, and the like is used as a substrate 501 in Embodiment 6. Note that quartz substrates, silicon substrates, and metallic substrates and stainless steel substrates on which an insulating film is formed may also be used as the substrate 501. Further, plastic substrates having heat resistant properties capable of withstanding the processing temperatures of Embodiment 6 may also be used. A synthesized quartz glass substrate is applied in Embodiment 6.

A lower portion light shielding film 503 is formed next on the quartz substrate 501. A base insulating film 502 is formed first from an insulating film such as a silicon nitride film, a silicon oxide film, or a silicon oxynitride film having a film thickness of 10 to 200 nm, preferably between 10 and 150 nm (typically from 50 to 100 nm). The lower portion light shielding film 503 is formed from a conductive material capable of withstanding the processing temperatures of Embodiment 6, such as Ta, W, Cr, or Mo, or from a laminate structure of such elements, at a film thickness on the order of 300 nm. The lower portion light shielding film functions as a gate wiring. A 75 nm thick crystalline silicon film is formed in Embodiment 6, and after forming a WSix film (where x=2.0 to 2.8), unnecessary portions are etched, forming a lower portion light shielding film 503. Note that although a single layer structure is used as the lower portion light shielding film 503 in Embodiment 6, a laminate structure having two or more layers may also be used.

A base film 504 is then formed having a film thickness of 10 to 650 nm (preferably between 50 and 600 nm) from an insulating film such as a silicon oxide film, a silicon nitride film, or a silicon oxynitride film. A single layer structure is used as the base film 504 in Embodiment 6, but a laminate structure in which two or more layers of the insulating films are laminated may also be used. A silicon oxynitride film made formed by plasma CVD using $SiH_4$, $NH_3$, and $N_2O$ as reactant gasses is formed as the base film 504 in Embodiment 6. The silicon oxynitride film 504 (Si=32%, O=27%, N=24%, H=17%) is formed having a film thickness of 580 nm.

A semiconductor film 505 is formed next on the base film 504. A semiconductor film 505 having an amorphous structure with a thickness of 25 to 200 nm (preferably between 30 and 100 nm) is formed by a known means such as sputtering, LPCVD or plasma CVD There are no limitations placed on the semiconductor film material, but it is preferable to form the semiconductor film from silicon, a silicon germanium (SiGe) alloy, or the like.

The semiconductor film 505 is then exposed to an atmosphere in which a gas, having as its main constituent one or a plurality of members selected from the group consisting of inert gas elements, nitrogen, and ammonia, is processed into a plasma. A plasma generation apparatus (such as a plasma CVD apparatus or a dry etching apparatus) is used in order to turn the gas into a plasma, and the exposure of the semiconductor film is performed for 30 seconds to 20 minutes (preferably from 3 to 15 minutes). In addition, it is preferable to perform processing while setting the gas flow rate to from 50 to 300 sccm, the substrate temperature from 200 to 500° C., and an RF power from 100 to 400 W. A plasma CVD apparatus is used in Embodiment 5, Ar gas is introduced, and plasma processing is performed for 5 minutes.

Thermal crystallization using a catalyst (metal element) such as nickel is then performed, crystallizing the semiconductor film. Further, in addition to thermal crystallization using a catalyst such as nickel, a known crystallization process (such as laser crystallization or thermal crystallization) may also be performed in combination. An aqueous nickel acetate solution (per weight concentration 5 ppm, volume 10 ml) is applied to the entire surface of the film by spin coating in Embodiment 5 to form an aqueous nickel acetate solution film 500, and this is exposed for 12 hours at a temperature of 500° C. in a nitrogen atmosphere.

Further, if a laser crystallization method is also applied, a continuous oscillation or a pulse oscillation solid state laser, gaseous state laser, metallic laser, and the like can be used. Note that continuous oscillation or pulse oscillation lasers such as YAG lasers, $YVO_4$ lasers, YLF lasers, $YAlO_3$ lasers, glass lasers, ruby lasers, alexandrite lasers, and Ti:sapphire lasers, may be used as solid state lasers. Examples of gaseous state lasers include continuous oscillation or pulse oscillation excimer lasers, Ar lasers, Kr lasers, and $CO_2$ lasers, while helium cadmium lasers, copper vapor lasers, and gold vapor lasers can be given as examples of metallic lasers. If a laser is used, a method in which a laser beam emitted form a laser oscillator is condensed into a linear shape by an optical system may be used. Conditions for crystallization may be suitably set by the operator, but the pulse oscillation frequency is set to 300 Hz and the laser energy density is set to from 100 to 800 $mJ/cm^2$ (typically between 200 and 700 $mJ/cm^2$) if an excimer laser is used. Further, the second harmonic is utilized if a YAG laser is used, the pulse oscillation frequency is set to form 1 to 30 Hz, and the laser energy density is set to form 300 to 1500 $mJ/cm^2$, preferably between 300 and 1000 mJ/cm2 (typically from 350 to 800 $mJ/cm^2$). The laser beam, condensed into a linear shape with a width of 100 to 1000 $\mu$m, for example 400 $\mu$m, may then be irradiated over the entire substrate surface. This may be performed such that the overlap ratio for the linear shape laser beam at this point is from 50 to 98%. Furthermore, it is necessary for the energy density to be set to from 0.01 to 100 $MW/cm_2$ (preferably from 0.1 to 10 $MW/cm^2$) if a continuous oscillation laser is used. It is then preferable to irradiate the laser light by moving a stage relative to the laser beam at a speed of 0.5 to 2000 cm/s.

A crystalline semiconductor film having a small grain size can thus be formed.

Gettering is then performed in order to remove from, or reduce the concentration of, the metal element used in order to promote crystallization in semiconductor layers that become active regions. The method disclosed in Japanese Patent Application Laid-open No. Hei 10-270363 may be applied for gettering A silicon oxide film having a film thickness of 50 nm is formed as a mask in Embodiment 5, patterning is performed, and silicon oxide layers 506a to 506d having predetermined shapes are obtained. Phosphorous (P) is then selectively injected into the semiconductor film, and heat treatment is performed The metal element can thus be removed from the semiconductor layers, or reduced in concentration to a level at which it does not influence the semiconductor characteristics of the semiconductor layers. A lowered off current value, and a high electric field mobility can be obtained due to good crystallinity for TFTs having active regions thus manufactured. Good characteristics can thus be achieved Etching of the crystalline semiconductor film is then performed, forming semiconductor layers 507a to 510a.

The masks 506a to 506d to be the silicon oxide films are removed next, a new insulating film 511 is formed, and heat treatment processing is performed in order to increase the crystallinity of the semiconductor film. It is preferable to thermally oxidize an upper portion of the semiconductor film. Heat treatment is performed using an annealing furnace after forming a 20 nm thick silicon oxide film by using an LPCVD apparatus in Embodiment 5. Upper portions of the semiconductor layers 507a to 510a are oxidized by this process. If the insulating film 511 and the oxidized portions of the semiconductor film layers are then etched, semiconductor layers 507b to 510b having increased crystallinity can be obtained.

Doping of a small amount of an impurity element (boron or phosphorous) may also be performed after forming the semiconductor layers 507b to 510b in order to control the TFT threshold value.

A first gate insulating film 512a is formed next, covering the semiconductor layers 507b to 510b. The first gate insulating film 512a is formed by an insulating film containing silicon with a thickness of 20 to 150 nm using plasma CVD or sputtering. A silicon oxynitride film having a film thickness of 35 nm (composition ratio: Si=32%; O=59%; N=7%; H=2%) is formed using plasma CVD in Embodiment 6. The gate insulating film is of course not limited to a silicon oxynitride film, and other insulating films containing silicon may also be used.

Further, when using a silicon oxide film, it can be formed by plasma CVD with a mixture of TEOS (tetraethyl orthosilicate) and $O_2$, at a reaction pressure of 40 Pa with the substrate temperature set to from 300 to 400° C., and by discharging at a high frequency (13.56 MHz) electric power density of 0.5 to 0.8 $W/cm^2$. Good characteristics as a gate insulating film can be obtained by subsequently performing thermal annealing at a temperature of 400 to 500° C. with respect to the silicon oxide film manufacture.

The gate insulating film is then partially etched, exposing the semiconductor layer 510b which becomes one electrode of a storage capacitor, and an impurity element is introduced to the semiconductor layer 510b. A resist mask 513a and 513b are formed on other regions at this point, and therefore the impurity element is not introduced there. Doping is performed in Embodiment 6 using P (phosphorous) as the impurity element, with an acceleration voltage of 10 keV and a dosage of $5 \times 10^{14}/cm^2$.

A second gate insulating film 512b is formed next. The second gate insulating film 512b is formed of an insulating film containing silicon with a thickness of 20 to 150 nm using plasma CVD or sputtering. A silicon oxynitride film having a film thickness of 50 nm (composition ratio: Si=32%; O=59%; N=7%; H=2%) is formed using plasma CVD in Embodiment 6. The gate insulating film is of course not limited to a silicon oxynitride film, and other insulating films containing silicon may also be used.

A first conductive film 515 having a film thickness of 20 to 100 nm, and a second conductive film 516 having a film thickness of 100 to 400 nm are then formed in lamination after forming a contact hole for connecting to the lower portion light shielding film. The first conductive film 515, made of a 30 nm thick TaN film, and the second conductive film 516, made of a 370 nm thick W film, are formed and laminated in Embodiment 5. The TaN film is formed by sputtering using a Ta target in a nitrogen atmosphere. Further, the W film is formed by sputtering using a W target. In addition, the W film can also be formed by thermal CVD using tungsten hexafluoride ($WF_6$). Whichever is used, it is necessary to make the film low resistance in order to use it as a gate electrode, and it is desirable that the resistivity of the W film be made equal to or less than 20 $\mu\Omega$cm. The resistivity can be lowered by enlarging the crystal grains of the W film, but crystallization is inhibited for cases where there are many impurity elements such as oxygen within the W film, and the film thus becomes high resistance. A resistivity of 9 to 20 $\mu\Omega$cm can be achieved by sputtering using a high purity W target (99.9999% purity), and in addition by forming the W film while taking sufficient care that no impurities from within the-gas phase are introduced at the time of film formation.

Note that, although the first conductive film 515 is TaN and the second conductive film 516 is W in Embodiment 5, the conductive films are not limited to such films. The first conductive film 515 and the second conductive film 516 may both also be formed from an element selected from the group consisting of Ta, W, Ti, Mo, Al, Cu, Cr, and Nd, from an alloy material having one of these elements as its main constituent, or from a chemical compound of these elements. Further, a semiconductor film, typically a crystalline silicon film into which an impurity element such as phosphorous is doped, may also be used, as may an AgPdCu alloy. Examples of combinations other than that used in Embodiment 6 include: forming the first conductive film by a tantalum (Ta) film and combining it with the second conductive film formed from a W film; forming the first conductive film by a titanium nitride (TiN) film and combining it with the second conductive film formed from a W film; forming the first conductive film by a tantalum nitride (TaN) film and combining it with the second conductive film formed from an Al film; and forming the first conductive film by a tantalum nitride (TaN) film and combining it with the second conductive film formed from a Cu film.

Masks (not shown in the figures) formed from resist are formed next using photolithography, and a etching process is performed in order to form electrodes and wirings. An ICP (inductively coupled plasma) etching method is used in Embodiment 6, and the etching conditions include: a gas mixture of CF4, Cl2, and O2 is used as an etching gas; the gas flow rates are set to 25:25:10 sccm, respectively; and a plasma is generated by applying a 500 W RF electric power (13.56 MHz) to a coil shape electrode at 1 Pa, thereby performing etching. A dry etching apparatus (model E645-ICP) using ICP which is produced by Matsushita Electric Inc. is employed. A 150 W RF electric power (13.56 KHz) is also applied to the substrate side (test piece stage), effectively applying a negative self-bias voltage.

A third doing process is then performed, and a impurity element that imparts n-type conductivity is introduced into the semiconductor films (FIG. 7A). The doping process may be conducted by ion doping or ion injection. Ion doping is performed at conditions of a dosage of $1\times10^{13}$ to $5\times10^{14}$/$cm^2$, and an acceleration voltage of 30 to 80 keV. The dosage is set to $1.5\times10^{13}$/$cm^2$ in Embodiment 5, and doping is performed at an acceleration voltage of 60 keV. A periodic table group 15 element, typically phosphorous (P) or arsenic (As) is used, and phosphorous (P) here in Embodiment 5, is used as the impurity element that imparts n-type conductivity. In this case, the conductive layers 517 to 521 become masks with respect to the impurity element that imparts n-type conductivity, and low concentration impurity regions 523 and 524 are formed in a self-aligning manner. The n-type conductivity imparting impurity element is added to the low concentration impurity regions 523 and 524 at a concentration range of $1\times10^{18}$ to $1\times10^{20}$ cm/$^3$. A mask 522 made from resist is formed on the semiconductor layers used in forming a p-channel TFT; and the impurity element that imparts n-type conductivity is thus not introduced to these semiconductor layers.

The resist mask is then removed, new masks are formed, and a fourth doping process is performed as shown in FIG. 7B. Doping is performed by ion doping with a dosage of $1\times10^{13}$ to $1\times10^{15}$/$cm^2$ and the acceleration voltage set to 30 to 120 keV. At this time, a mask 525b is formed so that an impurity element that imparts n-type conductivity is not introduced to semiconductor layers that form p-channel TFTs, and masks 525a and 525c are formed in order to form high concentration impurity regions selectively in the semiconductor layers for forming n-channel TFTs. In Embodiment 6, the dosage is set to $2\times10^{15}$/$cm^2$, and doping is performed with the acceleration voltage set to 50 keV. High concentration impurity regions 526 and 529, low concentration impurity regions 527 and 530, and channel forming regions 528 and 531.

The resist masks are removed next, after which new masks 532a and 532b are formed from resist, and a fifth doping process is performed as shown in FIG. 7C. An impurity region 533, to which an impurity element that imparts a conductivity type opposite the above single conductivity type is added, and which becomes a p-channel TFT active layer, is formed by the fifth doping process. An impurity element that imparts p-type conductivity is added by using the second conductive layer 518 as a mask against the impurity element, to thereby form an impurity region 533 in a self-aligning manner. The impurity region 533 is formed by ion doping using diborane ($B_2H_6$) in Embodiment 6. Ion doping is performed with a dosage of $1\times10^{13}$ to $1\times10^{15}$/$cm^2$ and an acceleration voltage set to from 30 to 120 keV. The semiconductor layers which form n-channel TFTs are covered by the resist masks 532a and 532b during the fifth doping process.

Figure 8A:
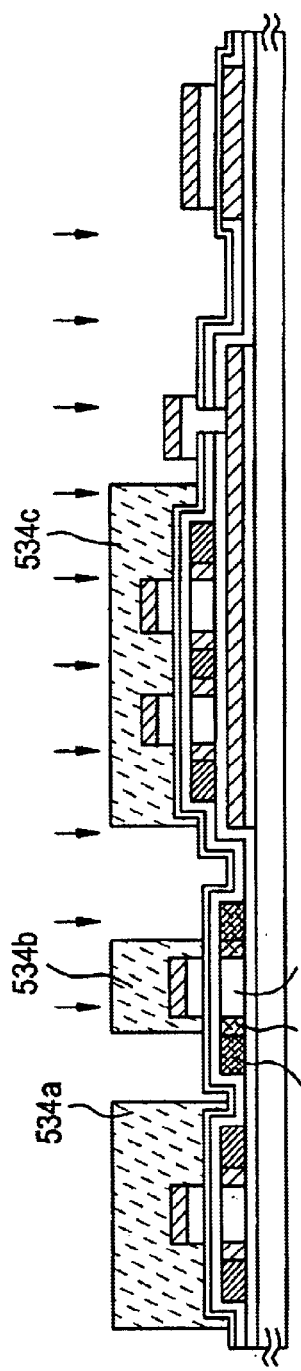
FIGS. 8A to 8C are cross sectional diagrams showing the method of manufacturing pixel TFTs and driver circuit TFTs.

The resist masks are then removed, new masks are formed, and a sixth doping process is performed as shown in FIG. 8A. Ion doping is performed with a dosage of $1\times10^{13}$ to $1\times10^{15}$/$cm^2$ and an acceleration voltage set to from 20 to 120 keV. Masks 534a and 534c are formed so that an impurity element that imparts p-type conductivity is not introduced into semiconductor layers which form n-channel TFTs, and a mask 534b is formed in order to selectively form a high concentration impurity region in the semiconductor layer for forming a p-channel TFT. The dosage is set to $1\times10^{15}$/$cm^2$ in Embodiment 6, and the acceleration voltage is set to 40 keV. A high concentration impurity region 535 is thus formed.

High concentration impurity regions and low concentration impurity regions are formed in the respective semiconductor layers by the above process steps.

A resist mask 534 (534a to 534c) is removed next, and a first interlayer insulating film 538 is formed. An insulating film containing silicon and having a thickness of 100 to 200 nm is formed as the first interlayer insulating film 538 by using plasma CVD or sputtering. A 150 nm thick silicon oxynitride film is formed in Embodiment 6 by plasma CVD. The first interlayer insulating film 538 is of course not limited to silicon oxynitride films, and other insulating films containing silicon may also be used, in single layer or laminate structure.

Figure 8B:
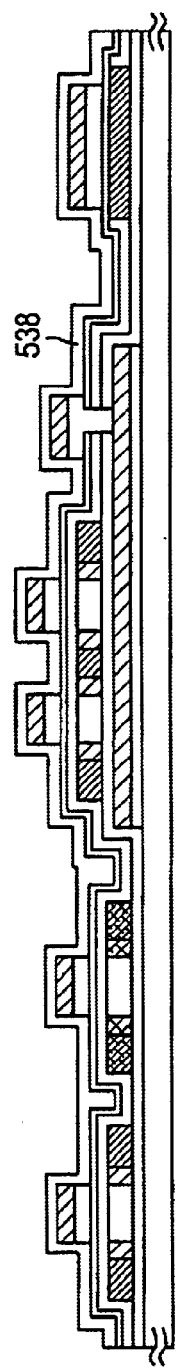

Heat treatment is performed next as shown in FIG. 8B, recovering crystallinity of the semiconductor layers, and performing activation of the impurity elements added to the respective semiconductor layers. Thermal annealing using an annealing furnace is performed for the heat treatment process. Thermal annealing may be performed at a temperature of 400 for 1000° C., typically between 500 and 550° C., in a nitrogen atmosphere having an oxygen concentration equal to or less than 1 ppm, preferably equal to or less than 0.1 ppm. Activation process is performed by heat treatment for 30 minutes at 950° C. in Embodiment 6. Note that, in addition to thermal annealing, laser annealing using a laser such as a YAG laser, and rapid thermal annealing (RTA) can also be performed.

If heat treatment is performed using laser annealing, it is preferable to use a continuous emission or pulse emission solid state laser, gaseous state laser, or metal laser. It is necessary to set the energy density of laser light to from 0.01 to 100 MW/cm$^2$ (preferably between 0.01 and 10 MW/cm$^2$) if a continuous emission laser is used, and the substrate is moved at a speed of 0.5 to 2000 cm/s relative to the laser light. Further, it is preferable that the laser energy density be from 50 to 900 mJ/cm$^2$ (typically between 50 and 500 mJ/cm$^2$) at a frequency of 300 Hz if a pulse emission laser is used. The laser light may be overlapped from 50 to 98% at this time.

Heat treatment processing may also be performed before forming the first interlayer insulating film 538. However, if the wiring material used is weak with respect to heat, then it is preferable to perform heat treatment after forming an interlayer insulating film (an insulating film having silicon as its main constituent, for example, a silicon nitride film) in order to protect the wirings and the like, as in Embodiment 6.

Hydrogenation processing can be performed if heat treatment is performed (at a temperature of 300 to 550° C. for 1 to 12 hours). This process is one of terminating dangling bonds in the semiconductor layers by hydrogen contained in the first interlayer insulating film 538. The semiconductor layers can also be hydrogenated, of course, irrespective of the presence of the first interlayer insulating film. As another means for hydrogenation, plasma hydrogenation (using hydrogen excited by a plasma) or heat treatment for 1 to 12 hours at 300 to 450° C. within an atmosphere containing hydrogen of 3 to 100% may also be performed.

Next, a second interlayer insulating film 539 made from an inorganic insulating material or an organic insulating material is formed on the first interlayer insulating film 538. A 1 μm thick silicon oxynitride film is formed in Embodiment 6.

Wirings 540 to 542 electrically connected to the impurity regions are then formed in a driver circuit 555. Further, in a pixel portion 556, source wirings 543 and 545, and a drain electrode 544 are formed. Note that a lamination film of a 50 nm thick Ti film and a 500 nm thick alloy film (Al and Ti alloy film) is patterned in order to form the wirings. There are no limitations regarding the two layer structure, of course, and a single layer structure or a laminate structure having three or more layers may also be used. Further, the wiring material is not limited to Al and Ti. For example, a lamination film, in which Al or Cu is formed on a TaN film, and then a Ti film is formed, may be patterned, forming the wirings.

Figure 8C:
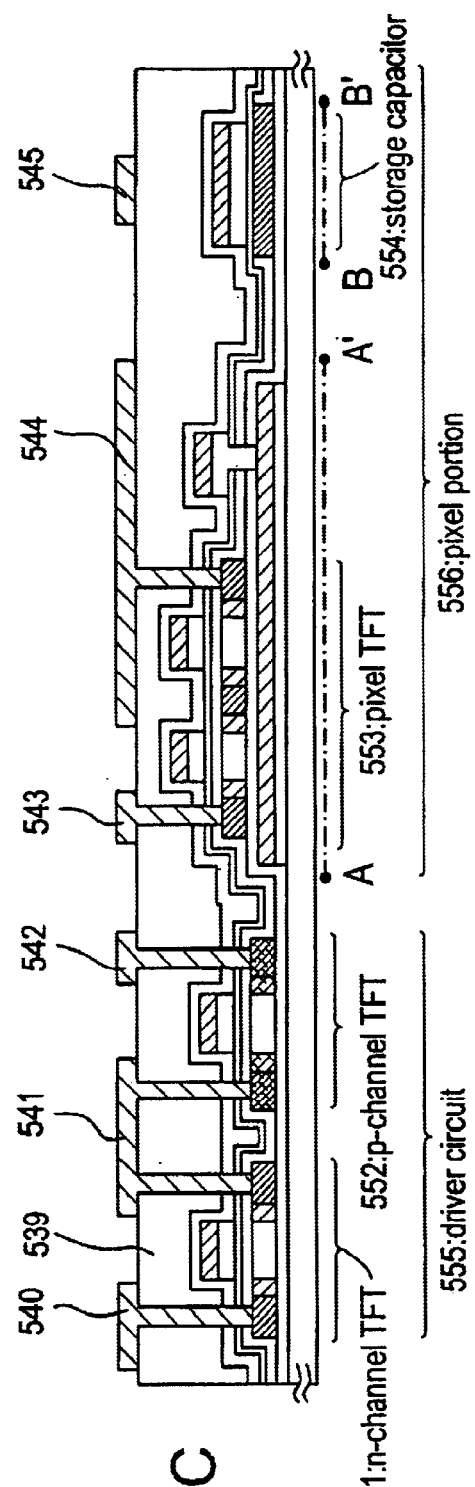
Figure 9:
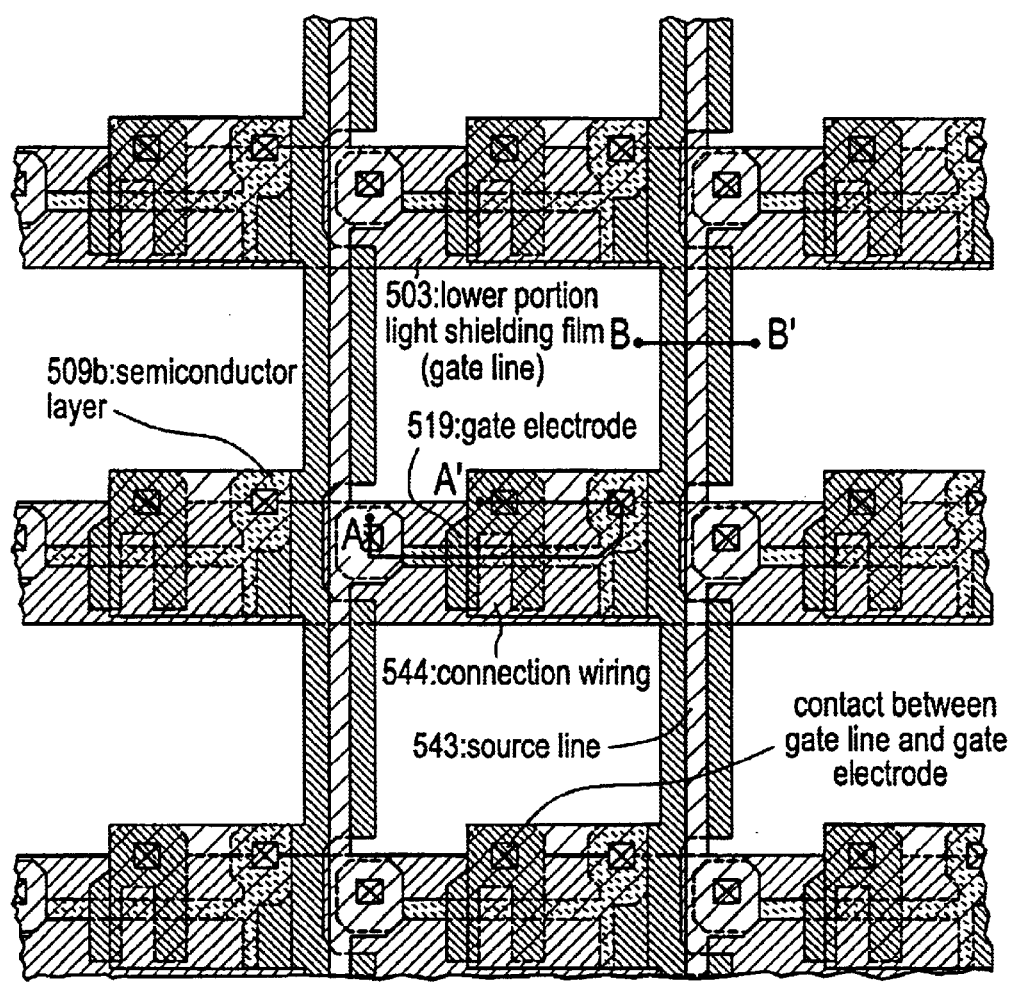
FIG. 9 is an upper surface diagram showing the structure of a pixel TFT.

An upper surface diagram of the state of manufacturing up through this point is shown in FIG. 9. Note that the same reference symbols are used for portions corresponding to those of FIGS. 5A to 8C. A dashed line A–A' in FIG. 8C corresponds to a cross sectional diagram cut along a dashed line A–A' in FIG. 9. Further, a dashed line B–B' in FIG. 8C corresponds to a cross sectional diagram cut along a dashed line B–B' in FIG. 9.

As shown FIG. 10A, a third interlayer insulating film 560 made from an inorganic insulating material or an organic insulating material is formed next on the second interlayer insulating film 539. A 1.8 μm thick silicon oxynitride film is formed in Embodiment 6.

A film possessing high light shielding properties, such as Al, Ti, W, Cr, or a black color resin is formed on the third interlayer insulating film 560 and patterned into a desired shape, forming light shielding films 561 and 562. The light shielding films 561 and 562 are disposed in a mesh shape so as to shield light in portions other than opening portions of pixels. In addition, a fourth interlayer insulating film 563 is formed from an inorganic insulating material so as to cover the light shielding films 561 and 562. (FIG. 10B).

A contact hole leading to the connection wiring 544 is then formed, and a 100 nm thick transparent conductive film such as ITO is formed and patterned into a desired shape, forming pixel electrodes 564 and 565.

A driver circuit 555 having an CMOS circuit composed of an n-channel TFT 551 and a p-channel TFT 552, and a pixel portion 556 having a pixel TFT 553 and a storage capacitor 554 can thus be formed on the same substrate. An active matrix substrate is thus completed.

Note that it is possible to freely combine Embodiment 6 with any one of Embodiments 1 to 5.

Embodiment 7

Figure 11:
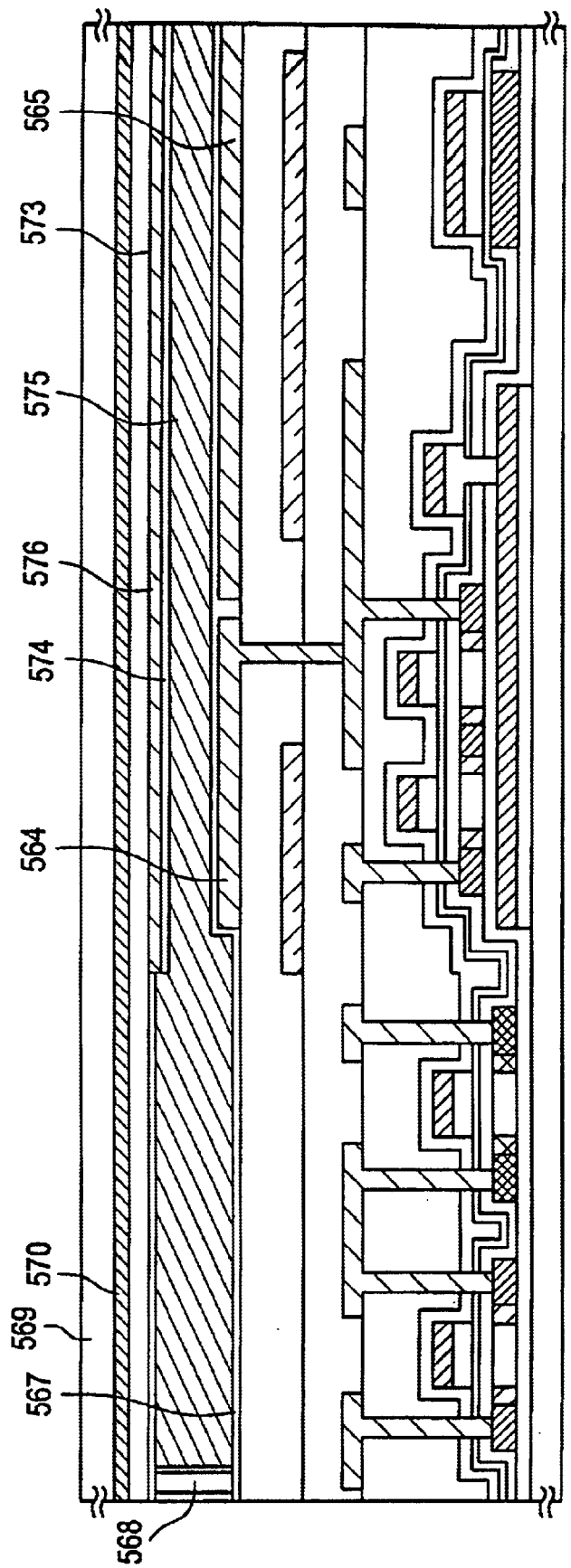
FIG. 11 is a cross sectional diagram showing a method of manufacturing an active matrix liquid crystal display device.

A process of manufacturing a reflecting liquid crystal display device from the active matrix substrate manufactured by Embodiment 6 is explained in Embodiment 7. FIG. 11 is used in the explanation. Although this Embodiment does not description the present invention, this Embodiment use an active matrix substrate manufactured in Embodiment 6. Therefore, it is considered that the present invention is applied for this Embodiment.

First, an orientation film 567 are formed at least on the pixel electrodes 564 and 565 on the active matrix substrate of FIG. 7C after obtaining the active matrix substrate in the state of FIG. 10B in accordance with Embodiment 6. A rubbing process is then performed. Note that, before forming the orientation film 567, rod shape spacers (not shown in the figure) are formed in predetermined positions in Embodiment 7 in order to maintain a substrate gap by patterning an organic resin film such as an acrylic resin film. Further, spherical shaped spacers may also be distributed over the entire substrate surface as a substitute for the rod shape spacers.

An opposing substrate 569 is prepared next, and a coloration layer 570 and a leveling film 573 are formed on the opposing substrate 569.

An opposing electrode 576 made from a transparent conductive film is then formed on at least the pixel portion on the leveling film 573, and an orientation film 574 is formed over the entire surface of the opposing substrate. A rubbing process is then performed.

The active matrix substrate on which the pixel portion and the driver circuit are formed, and the opposing substrate are next bonded by a sealing material 568. A filler is mixed into the sealing material 568, and the two substrate can be bonded while maintaining a uniform gap by the filler and the rod shape spacers. A liquid crystal material 575 is next injected between both substrates, which are then completely sealed by using a sealant (not shown in the figure). Known liquid crystal materials may be used for the liquid crystal material 575. The reflecting liquid crystal display device shown in FIG. 11 is thus completed. The active matrix substrate or the opposing substrate may then be sectioned into a desired shape if necessary. In addition a polarizing plate (not shown in the figure) is attached to only the opposing substrate, and an FPC is attached using a known technique.

A liquid crystal display panel thus manufactured can be used as the display portion of all types of electronic devices.

Note that it is possible to freely combine Embodiment 7 with any of Embodiments 1 to 6.

Embodiment 8

An example of manufacturing a light emitting device using the method of manufacturing a TFT employed when manufacturing the active matrix substrate shown in Embodiment 6 is explained in Embodiment 8. Although this Embodiment does not description the present invention, this Embodiment use an active matrix substrate manufactured in Embodiment 6. Therefore, it is considered that the present invention is applied for this Embodiment. The term light emitting device is a generic term in this specification used to indicate display panels in which light emitting elements formed on a substrate are enclosed between the substrate and a cover material, and to indicate display modules in which an IC is mounted to the display panel. Note that light emitting elements have a layer (light emitting layer) containing an organic compound in which electroluminescence generated by the addition of an electric field can be obtained, an anode layer, and a cathode layer. Further, light emission when returning to a base state from a singlet excitation state (fluorescence), and light emission when returning to a base state from a triplet excitation state (phosphorescence) exist as luminescence types for organic compounds, and either one or both of the types may be used for the emission of light.

Note that, within this specification, all layers formed between an anode and a cathode in a light emitting element are defined to be organic light emitting layers. Specifically, light emitting layers, hole injecting layers, electron injecting layers, hole transporting layers, electron transporting layers, and the like are included in the category of organic light emitting layers. Light emitting elements basically have a structure in which an anode layer, a light emitting layer, and a cathode are laminated in order. In addition to this structure, light emitting elements also have structure such as one in which an a hole injecting layer, a light emitting layer, and a cathode layer, or one in which an anode layer, a hole injecting layer, a light emitting layer, an electron transporting layer, and a cathode layer are laminated in order.

Figure 12:
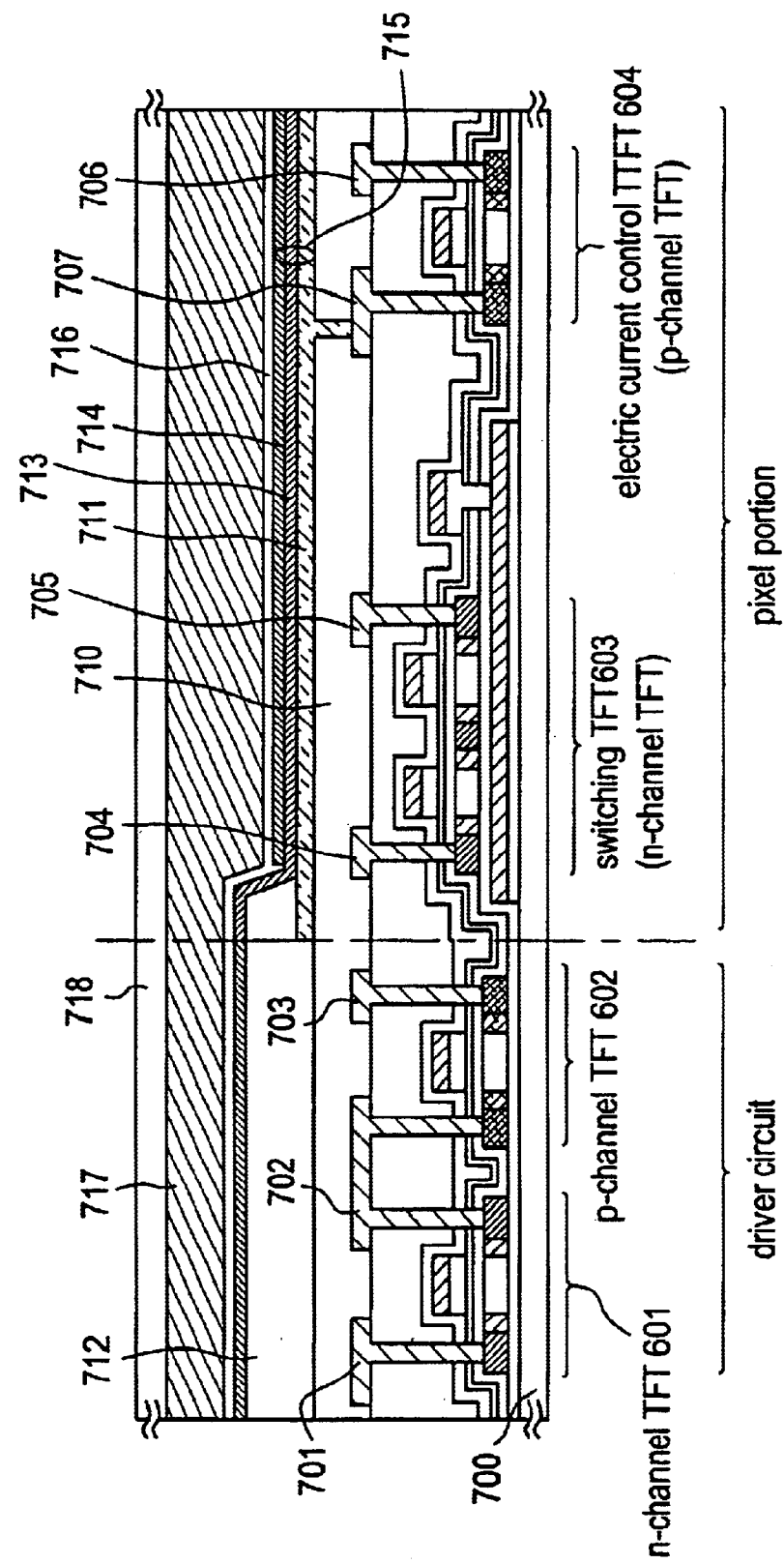
FIG. 12 is a cross sectional structure diagram of driver circuits and a pixel portion of a light emitting device.

FIG. 12 is a cross sectional diagram of a light emitting device of Embodiment 8. The n-channel TFT 551 of FIG. 8C is used for forming a switching TFT 603 formed on a substrate in FIG. 12. The explanation of the n-channel TFT 551 may therefore be referred to for an of the structure.

Note that, although a double gate structure in which two channel forming regions are formed is used in Embodiment 8, a single gate structure in which one channel forming region is formed, and a triple gate structure in which three channel forming regions are formed may also be used.

A driver circuit formed on the substrate 700 is formed using the CMOS circuit of FIG. 8C. The explanation of the n-channel TFT 551 and the p-channel TFT 552 may therefore be referred to for an explanation of the CMOS circuit structure. Note that although a single gate structure is used in Embodiment 8, a double gate structure or a triple gate structure may also be used.

Further, wirings 701 and 703 are source wirings of the CMOS circuit, and a wiring 702 functions as a drain wiring. A wiring 704 functions as a wiring that electrically connects a source wiring and a source region of the switching TFT. Although a wiring 705 is a wiring that electrically connects a drain region of the switching TFT, it functions as a gate electrode of an electric current control TFT 604.

Note that an electric current control TFT 604 is formed using the p-channel TFT 552 of FIG. 8C. The explanation of the p-channel TFT 552 may therefore be referred to for an explanation of the structure for the electric current control TFT 604. Note that although a single gate structure is shown here, a double gate structure or a triple gate structure may also be used.

A wiring 706 is a source wiring (corresponding to an electric current supply line) of the electric current control TFT 604, and reference numeral 707 denotes an electrode that is electrically connected to a pixel electrode 711 of the electric current control TFT 604 by overlapping with the pixel electrode 711.

Note that the reference numeral 711 denotes a pixel electrode (light emitting element anode) made from a transparent conductive film. A compound of indium oxide and tin oxide, a compound of indium oxide and zinc oxide, zinc oxide, tin oxide, and indium oxide can be used as the transparent conductive film. Further, gallium may also be added to the aforementioned transparent conductive films. The pixel electrode 711 is formed on a level interlayer insulating film 710 before forming the wirings. It is extremely important in Embodiment 8 to level steps due to the TFTs by using the leveling film 710 made from a resin. The light emitting layers formed later are extremely thin, and therefore light emitting failures may occur due to the existence of steps. It is therefore preferable to perform leveling before forming the pixel electrode so that the pixel electrode can be formed on as level a surface as possible.

A bank 712 is formed as shown in FIG. 12 after forming the pixel electrode 711. The bank 712 may be formed by patterning an insulating film containing silicon, or an organic resin film having a thickness of 100 to 400 nm.

Note that it is necessary to exercise caution against damage to the element due to static electricity during film formation because the bank 712 is an insulating film. Carbon particles or metal particles are added to the insulating film that becomes the bank 712 material in Embodiment 8, the resistivity is lowered, and the generation of static electricity is controlled. The amount of carbon particles or metal particles added may be regulated so that the resistivity becomes $1 \times 10^6$ to $1 \times 10^{12}$ Ũm (preferably between $1 \times 10^8$ and $1 \times 10^{10}$ Ũm).

A light emitting layer 713 is formed on the pixel electrode 711. Note that while only one pixel is shown in FIG. 12, the light emitting layer is divided into portions corresponding to the colors of R (red), G (green), and B (blue) in Embodiment 8. Further, a low molecular weight organic light emitting material may be formed by an evaporation method in Embodiment 8. Specifically, a laminate structure may be formed in which a 20 nm thick copper phthalocyanine (CuPc) film is formed as a hole injecting layer, and a 70 nm thick tris-8-aluminum quinolinolate complex ($Alq_3$) film may be formed on the CuPc film as a light emitting layer. The color of light emitted can be controlled by adding a fluorescing pigment such as quinacridon, perillin, or DCM1 to $Alq_3$.

Note that the above example is one example of organic light emitting materials capable of being used as the light emitting layer, and the light emitting layer need not be limited to these. A light emitting layer in which a light emitting layer, a charge transporting layer, and a charge injecting layer are freely combined (layer for emitting light and for performing transport of carriers for light emission) may also be used. For example, although an example of using low molecular weight organic light emitting materials as the light emitting layer is shown in Embodiment 8, intermediate molecular weight organic light emitting materials or high molecular weight light emitting materials may also be used. Note that, within this specification, organic light emitting materials that do not have sublimation properties, and in which the number of molecules is equal to or less than 20 or the molecular length is less than or equal to 10 μm, are taken as intermediate molecular weight organic light emitting materials. Furthermore, a laminate structure in which a 20 nm thick polythiophene (PEDOT) film is formed by a spinning application method as a hole injecting layer, and a paraphenylene vinylene (PPV) film having a thickness on the order of 100 nm is formed as a light emitting layer on the hole injecting layer, may be taken as an example of using a high molecular weight organic light material. Note that light emitting wavelengths from red to blue can be selected if π conjugate polymers of PPV are used. Further, it is also possible to use inorganic materials such as silicon carbide as electron transporting layers and electron injecting layers. Known materials can be used for these organic light emitting and inorganic materials.

A cathode 714 is formed next on the light emitting layer 713 from a conductive film. An alloy film of aluminum and lithium is used as the conductive film in Embodiment 8. A known MgAg film (an alloy film of magnesium and silver) may of course also be used. A conductive film made from an element residing in group 1 or group 2 of the periodic table, or a conductive film to which one of the group 1 or group 2 elements is added, may be used as the cathode material.

A light emitting element 715 is complete at the point up through the formation of the cathode 714. Note that the light emitting element 715 indicates a diode formed by the pixel electrode (anode) 711, the light emitting layer 713, and the cathode 714 here.

It is effective to form a passivation film 716 so as to cover the entire light emitting element 715. An insulating film containing a carbon film, a silicon nitride film, or a silicon oxynitride film is used as the passivation film 716, and a single layer or a lamination of the insulating films may be used.

It is preferable to use a film having good coverage as the passivation film, and the use of a carbon film, in particular a DLC (diamond like carbon) film is effective. It is possible to form DLC films within a temperature range from room temperature to 100° C. or less, and therefore it can easily be formed on the light emitting layer 713, which has a low resistance to heat. Further, DLC films have a high blocking effect with respect to oxygen, and it is thus possible to control oxidation of the light emitting layer 713. A problem of the light emitting layer 713 oxidizing during a subsequent sealing process can therefore be prevented.

In addition, a sealant 717 is formed on the passivation film 716, thereby a cover material 718 is bonded. An ultraviolet setting resin may be used as the sealant 717, and it is effective to form a substance having a hygroscopic effect or a substance having an oxidation preventing effect on an inside portion. Furthermore, a glass substrate, a quartz substrate, or a plastic substrate (including a plastic film) on which a carbon film (preferably a diamond like carbon film) is formed on both sides, is used as the cover material 718 in Embodiment 8.

A light emitting device having a structure like that shown in FIG. 12 is thus completed. Note that processes from after formation of the bank 712 until the formation of the passivation film 716 may be performed using a multi-chamber (or in-line) film formation apparatus. This is effective for processing in succession, without exposure to the atmosphere. Further, it is also possible to make additional advancements and perform processing consecutively up through the bonding of the cover material 718 without exposure to the atmosphere.

The n-channel TFTs 601 and 602 the switching TFT (n-channel TFT) 603, and the electric current control TFT (n-channel TFT) 604 are thus formed on the substrate. The number of masks necessary for the manufacturing process steps up to this point is less than the number for a conventional active matrix light emitting device.

In other words, the TFT manufacturing process steps can be greatly simplified, throughput can be increased, and a reduction in production costs can be achieved.

In addition, n-channel TFTs which are strong with respect to deterioration caused by the hot carrier effect can be formed by forming an impurity region overlapping with a gate electrode, through an insulating film, as explained using FIG. 12. A light emitting device having high reliability can therefore be realized.

Further, although only a pixel portion and a driver circuit are shown in Embodiment 7, it is also possible to form logic circuits such as a signal divider circuit, a D/A converter, an operation amplifier, and a γ compensation circuit in the same insulating body in accordance with the manufacturing process steps of Embodiment 7. In addition, memory circuits and microprocessors can also be formed.

FIGS. 13A and 13B are used for explaining the light emitting device of Embodiment 8 after processing up through a sealing (enclosing) step for protecting the light emitting elements. Note that the reference numerals used in FIG. 12 are also used in FIGS. 13A and 13B if necessary.

FIG. 13A is an upper surface diagram showing the state up through the performance of sealing the light emitting elements, and FIG. 13B is a cross sectional diagram of FIG. 13A cut along a line segment C–C'. Reference numeral 801 shown by a dotted line denotes a source side driver circuit, reference numeral 806 denotes a pixel portion, and reference numeral 807 denotes a gate side driver circuit. Further, reference numeral 901 denotes a cover material, reference numeral 902 denotes a first sealing material, and reference numeral 903 denotes a second sealing material. A sealant 907 is formed on the inside of a region surrounded by the first sealing material 902.

Note that reference numeral 904 denotes a wiring for transmitting signals input to the source side driver circuit 801 and the gate side driver circuit 807, and the wiring 904 receives video signals and clock signals from an external input terminal FPC (flexible printed circuit) 905. Note that, although only the FPC is shown in the figures here, a printed wiring board (PWB) may also be attached to the FPC. The light emitting device of the present specification includes not only the light emitting device body itself, but also the state in which an FPC or a PWB are attached to the light emitting device body.

The cross sectional structure is explained next using FIG. 13B. The pixel portion 806 and the gate side driver circuit 807 are formed on an upper side of a substrate 700. The pixel portion 806 is formed by a plurality of pixels containing the electric current control TFT 604 and the pixel electrode 711 electrically connected to the drain of the electric current control TFT 604. Furthermore, the gate side driver circuit 807 is formed using a CMOS circuit in which the n-channel TFT 601 and the p-channel TFT 602 are combined (refer to FIG. 8C).

The pixel electrode 711 functions as the anode of the light emitting element. Further, the banks 712 are formed in both edges of the pixel electrode 711, and the light emitting layer 713 and the cathode 714 of the light emitting element are formed on the pixel electrode 711.

The cathode 714 also functions as a common wiring between all pixels, and is electrically connected to the FPC 905 via the connection wiring 904. In addition, elements contained in the pixel portion 806 and the gate side driver circuit 807 are all covered by the cathode 714 and the passivation film 716.

The cover material 901 is bonded by the first-sealing material 902. Note that spacers made from a resin film may also be formed in order to maintain a gap between the cover material 901 and the light emitting elements. The sealant 907 is filled into the inside of the first sealing material 902. Note that it is preferable to use an epoxy resin for the first sealing material 902 and the sealant 907. Note that it is preferable to use an epoxy-based resin for the first sealing material 902 and the sealant 907. Further, it is desirable that the first sealing material 902 be a material through which as little as possible moisture and oxygen can pass. In addition, a substance possessing a hygroscopic effect and a substance possessing an oxidation preventing effect may also be included in the inside of the sealant 907.

The sealant 907 formed so as to cover the light emitting elements also functions as an adhesive in order to bond the cover material 901. Further, FRP (fiberglass reinforced plastic), PVF (polyvinyl fluoride), Mylar, polyester, and acrylic can be used as the material of the plastic substrate forming the cover material 901 in Embodiment 8.

After bonding the cover material 901 using the sealant 907, the second sealing material 903 is formed so as to cover the side surfaces (exposed surfaces) of the sealant 907. The same material as the first sealing material 902 can be used for the second sealing material 903.

The light emitting elements can be completely cut off from the outside by sealing the light emitting elements using the sealant 907 in the light emitting device having the aforementioned structure. In addition, the incursion of substances from the outside, such as moisture and oxygen, that promote deterioration by oxidizing the light emitting layers can be prevented. A light emitting device having high reliability can therefore be obtained.

Note that it is possible to freely combine Embodiment 8 with any of Embodiments 1 to 7.

Embodiment 8

Many kinds of light electro-optical devices (active matrix liquid crystal display devices, active matrix light emitting devices, and active matrix EC display devices) can be manufactured by applying the present invention. In other words, the present invention can be implemented in all electronic devices in which such an electro-optical device is built in as a display portion. Note that although this Embodiment does not description the present invention, the light electro-optical devices in this Embodiment are manufactured by combining with each of Embodiments 1–8. Therefore, it is considered that the present invention is applied for this Embodiment.

Video cameras, digital cameras, projectors, head mounted displays (goggle displays), car navigation systems, car stereos, personal computers, and portable information terminals (such as mobile computers, portable telephones, and electronic books) can be given as examples of such electronic devices. Examples of these are shown in FIGS. 14A to 14F, FIGS. 15A to 15D, and in FIGS. 16A to 16C.

Figure 14A:
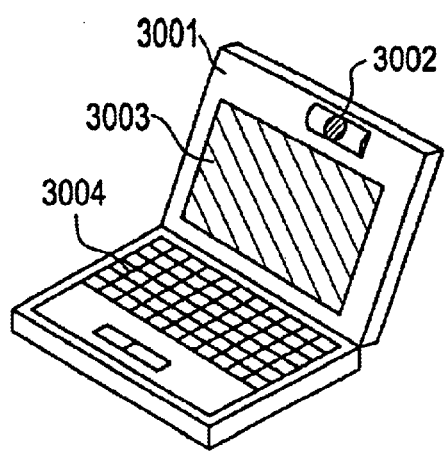
FIGS. 14A to 14F are diagrams showing examples of semiconductor devices.

FIG. 14A is a personal computer, and includes a main body 3001, an image input portion 3002, a display portion 3003, and a keyboard 3004. The present invention can be applied to the display portion 3003.

Figure 14B:
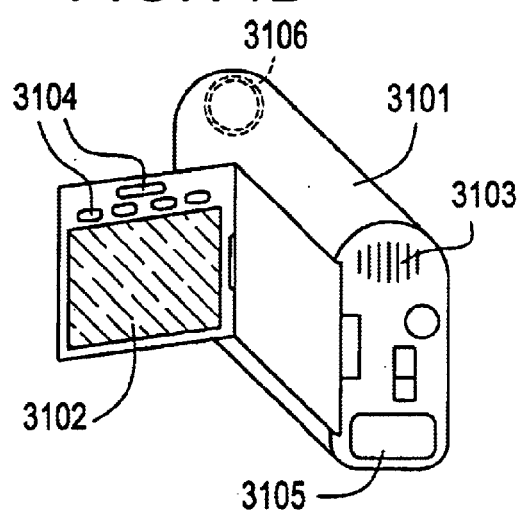

FIG. 14B is a video camera, and includes a main body 3101, a display portion 3102, an audio input portion 3103, operation switches 3104, a battery 3105, and an image receiving portion 3106. The present invention can be applied to the display portion 3102.

Figure 14C:
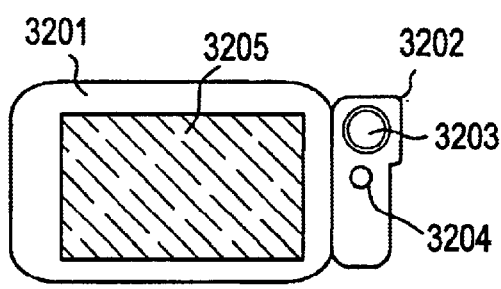

FIG. 14C is a mobile computer, and includes a main body 3201, a camera portion 3202, an image receiving portion 3203, operation switches 3204, and a display portion 3205. The present invention can be applied to the display portion 3205.

Figure 14D:
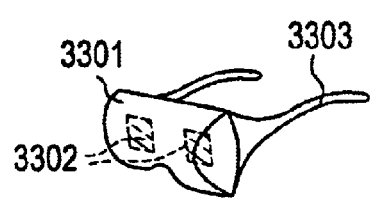

FIG. 14D is a goggle display, and includes a main body 3301, a display portion 3302, and an arm portion 3303. The present invention can be applied to the display portion 3302.

Figure 14E:
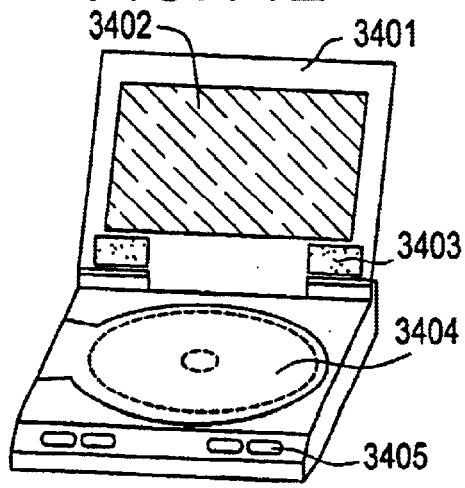

FIG. 14E is a player using a recording medium for recording a program (hereafter referred to as a recording medium), and includes a main body 3401, a display portion 3402, a speaker portion 3403, a recording medium 3404, and operation switches 3405. Note that the player uses media such as DVDs (digital versatile discs) and CDs as recording media, and that music appreciation, film appreciation, games, and Internet use can be performed. The present invention can be applied to, the display portion 3402.

Figure 14F:
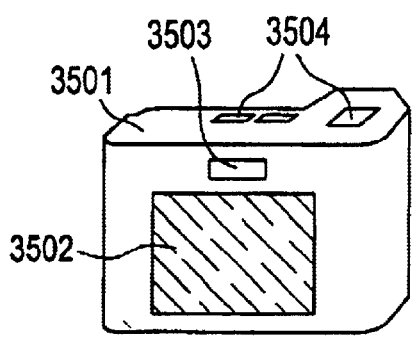

FIG. 14F is a digital camera, and includes a main body 3501, a display portion 3502, a viewfinder 3503, operation switches 3504, and an image receiving portion (not shown in the figure). The present invention can be applied to the display portion 3502.

Figure 15A:
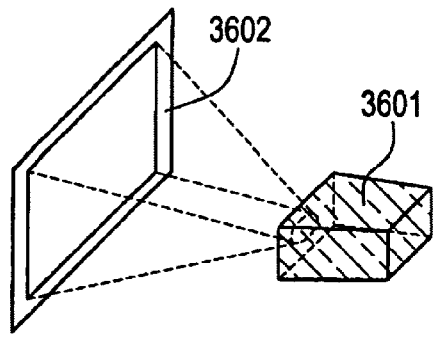
FIGS. 15A to 15D are diagrams showing examples of semiconductor devices.

FIG. 15A is a front projector, and includes a projector apparatus 3601 and a screen 3602. The present invention can be applied to a liquid crystal display device 3808 of FIG. 15C structuring a portion of the projector apparatus 3601, and to other driver circuits.

Figure 15B:
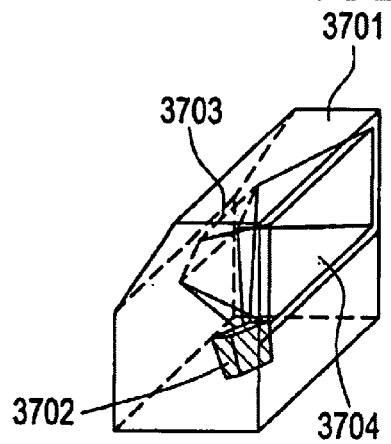

FIG. 15B is a rear projector, and includes a main body 3701, a projector apparatus 3702, a mirror 3703, and a screen 3704. The present invention can be applied to the liquid crystal display device 3808 of FIG. 15C structuring a portion of the projector apparatus 3702, and to other driver circuits.

Figure 15C:
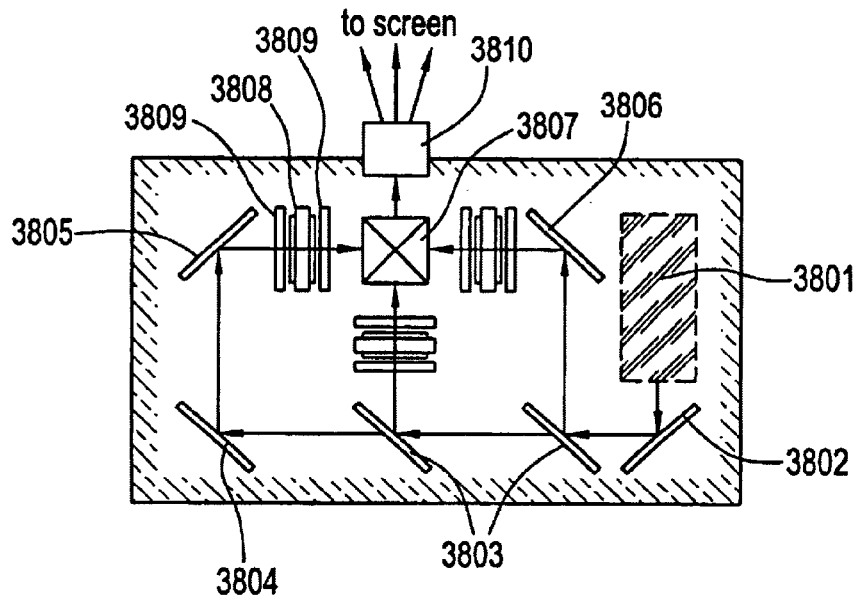

Note that an example of the structure of the projector apparatuses 3601 and 3702 of FIG. 15A and FIG. 15B, respectively, is shown in FIG. 15C. The projector apparatuses 3601 and 3702 are composed of a light source optical system 3801, mirrors 3802 and 3804 to 3806, a dichroic mirror 3803, a prism 3807, a liquid crystal display device 3808, a phase difference plate 3809, and a projecting optical system 3810. The projecting optical system 3810 is composed of an optical system prepared with projecting lenses. Although this structure is referred to as a three-plate type for using three of the display devices 3808, Embodiment 9 is not limited thereto, for example, the structure may be a single-plate type. Further, optical systems such as optical lenses, films having a light polarizing function, films for regulating the phase, and IR films may be suitably placed in the optical path shown by the arrow in FIG. 15C by the operator.

Figure 15D:
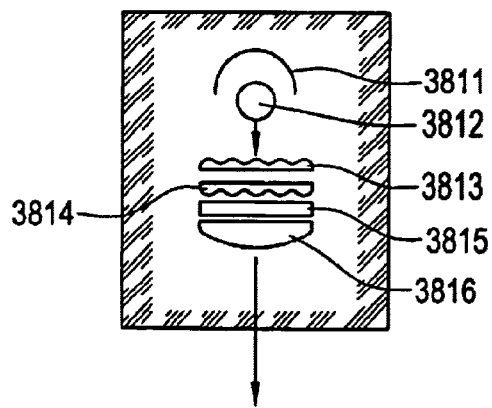

FIG. 15D is a diagram showing one example of a structure of the light source optical system 3801 in FIG. 15C. In Embodiment 9, the light source optical system 3801 is composed of a reflector 3811, a light source 3812, lens arrays 3813 and 3814, a polarizing transformation element 3815, and a condenser lens 3816. Note that the light source optical system shown in FIG. 15D is one example, and the light source optical system is not limited to the structure shown in the figure. For example, optical systems such as an optical lens, a film having a light polarizing function, a film for regulating the phase, and an IR film may be suitably added by the operator.

Note that a case of using a transmitting electro-optical device is shown for the projector of FIGS. 15A to 15D, and examples of applying the present invention to reflecting electro-optical devices and to light emitting devices are not shown in the figures.

Figure 16A:
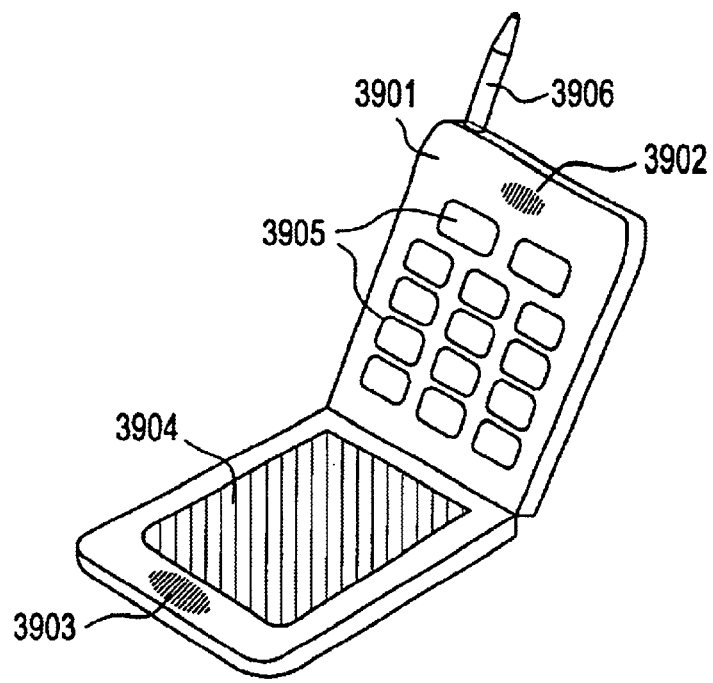
FIGS. 16A to 16C are diagrams showing examples of semiconductor devices.

FIG. 16A is a portable telephone, and includes a main body 3901, an audio output portion 3902, an audio input portion 3903, a display portion 3904, operation switches 3905, and an antenna 3906. The present invention can be applied to the 'display portion 3904.

Figure 16B:
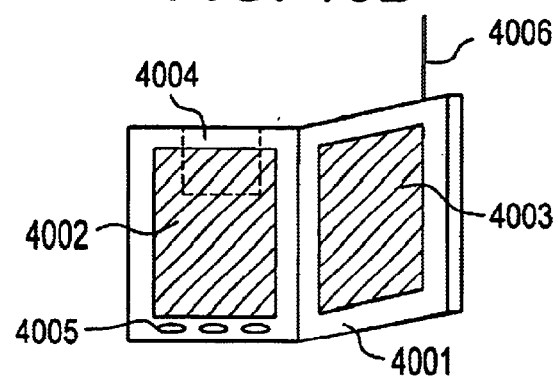

FIG. 16B is a portable book (electronic book), and includes a main body 4001, display portions 4002 and 4003, a recording medium 4004, operation switches 4005, and(an antenna 4006. The present invention can be applied to the display portions 4002 and 4003.

Figure 16C:
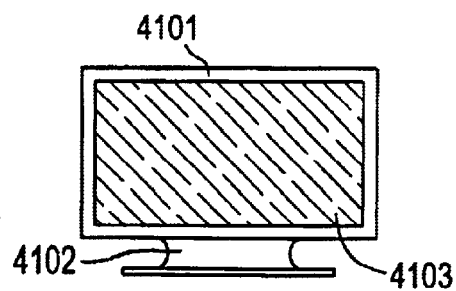

FIG. 16C is a display, and includes a main body 4101, a support stand 4102, and a display portion 4103. The present invention can be applied to the display portion 4103. The display of the present invention is particularly effective for cases of large screen size, and is effective in displays having a diagonal size equal to or greater than 10 inches (in particular, equal to or greater than 30 inches).

The applicable range of the present invention is thus extremely wide, and it is possible to apply the present invention to electronic devices of various fields. Further, the electronic devices of Embodiment 9 can be realized by using a structure in which any of Embodiments 1 to 7 or Embodiment 8, are combined.

The following fundamental significance can be achieved by employing the constitution of the present invention:

a) A simple method applicable to conventional TFT manufacturing processes;

b) The time required for crystallization is shortened, and therefore it is possible to achieve cost reductions;

c) the generation density of crystal nuclei is increased, and grain size can be made smaller; and d) crystalline semiconductor films having good crystallinity can be formed by satisfying the above advantages, and TFTs having superior electrical characteristics can be manufactured by using the crystalline semiconductor films. Further, it is possible to suppress display irregularities provided that the TFTs are used as display portions in all types of semiconductor devices.

What is claimed is:

1. A method of manufacturing a semiconductor device comprising the steps of:
exposing a semiconductor film to a plasma of a gas comprising at least an inert gas;
providing the semiconductor film with a metal containing material after exposing the semiconductor film to the plasma; and
crystallizing the semiconductor film by heating after providing the metal containing material.

2. A method according to claim 1, wherein the semiconductor film is exposed to the plasma by using a plasma CVD apparatus or a dry etching apparatus.

3. A method according to claim 1, wherein the metal containing material is selected from the group consisting of Fe, Co, Ni, Ru, Rh, Pd, Os, Ir, Pt, Cu, Ag, Au, Al, In, Sn, Pb, P, As, and Sb.

4. A method according to claim 1, further comprising incorporating the semiconductor film into an electronic device selected from the group consisting of a video camera, a digital camera, a projector, a head mounted display, a car navigation system, a car stereo, a personal computer, and a portable information terminal.

5. A method according to claim 1, wherein the inert gas is argon.

6. A method according to claim 1, wherein the metal containing material is provided by evaporation, ion injection, sputtering, or solution application.

7. A method of manufacturing a semiconductor device comprising the steps of:
exposing a semiconductor film to a plasma of a gas comprising at least an inert gas;
providing the semiconductor film with a metal containing material after exposing the semiconductor film to the plasma;
crystallizing the semiconductor film by heating after providing the metal containing material; and
performing laser annealing to the semiconductor film after crystallizing the semiconductor film.

8. A method according to claim 7, wherein the semiconductor film is exposed to the plasma by using a plasma CVD apparatus or a dry etching apparatus.

9. A method according to claim 7, wherein the metal containing material is selected from the group consisting of Fe, Co, Ni, Ru, Rh, Pd, Os, Ir, Pt, Cu, Ag, Au, Al, In, Sn, Pb, P, As, and Sb.

10. A method according to claim 7, further comprising incorporating the semiconductor film into an electronic device selected from the group consisting of a video camera, a digital camera, a projector, a head mounted display, a car navigation system, a car stereo, a personal computer, and a portable information terminal.

11. A method according to claims 7, wherein the inert gas is argon.

12. A method according to claim 7, wherein the metal containing material is provided by evaporation, ion injection, sputtering, or solution application.

13. A method of manufacturing a semiconductor device comprising the steps of:
exposing a semiconductor film to a plasma of a gas selected from the group consisting of inert gas, nitrogen gas, and ammonia gas;
providing the semiconductor film with a metal containing material after exposing the semiconductor film to the plasma; and
crystallizing the semiconductor film by heating after providing the metal containing material.

14. A method according to claim 13, wherein the semiconductor film is exposed to the plasma by using a plasma CVD apparatus or a dry etching apparatus.

15. A method according to claim 13, wherein the metal containing material is selected from the group consisting of Fe, Co, Ni, Ru, Rh, Pd, Os, Ir, Pt, Cu, Ag, Au, Al, In, Sn, Pb, P, As, and Sb.

16. A method according to claim 13, further comprising incorporating the semiconductor film into an electronic device selected from the group consisting of a video camera, a digital camera, a projector, a head mounted display, a car navigation system, a car stereo, a personal computer, and a portable information terminal.

17. A method according to claim 13, wherein the metal containing material is provided by evaporation, ion injection, sputtering, or solution application.

18. A method of manufacturing a semiconductor device comprising the steps of:
exposing a semiconductor film to a plasma of a gas comprising at least an inert gas;
providing the semiconductor film with a metal containing material before exposing the semiconductor film to the plasma; and
crystallizing the semiconductor film by heating after providing the metal containing material.

19. A method according to claim 18, wherein the metal containing material is provided by evaporation, ion injection, sputtering, or solution application.

20. A method of manufacturing a semiconductor device comprising the steps of:
exposing a semiconductor film to a plasma of a gas comprising at least an inert gas;
providing the semiconductor film with a metal containing material before exposing the semiconductor film to the plasma;
crystallizing the semiconductor film by heating after providing the metal containing material; and performing laser annealing to the semiconductor film after crystallizing the semiconductor film.

21. A method according to claim 20, wherein the metal containing material is provided by evaporation, ion injection, sputtering, or solution application.

22. A method of manufacturing a semiconductor device comprising the steps of:

exposing a semiconductor film to a plasma of a gas selected from the group consisting of inert gas, nitrogen gas, and ammonia gas;

providing the semiconductor film with a metal containing material before exposing the semiconductor film to the plasma; and crystallizing the semiconductor film by heating after providing the metal containing material.

23. A method according to claim 22, wherein the metal containing material is provided by evaporation, ion injection, sputtering, or solution application.

* * * * *